(12) United States Patent
Kopp et al.

(10) Patent No.: US 11,239,392 B2
(45) Date of Patent: Feb. 1, 2022

(54) OPTOELECTRONIC SEMICONDUCTOR CHIP, HIGH-VOLTAGE SEMICONDUCTOR CHIP AND METHOD FOR PRODUCING AN OPTOELECTRONIC SEMICONDUCTOR CHIP

(71) Applicant: OSRAM OLED GmbH, Regensburg (DE)

(72) Inventors: Fabian Kopp, Penang (MY); Attila Molnar, Penang (MY)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/634,165

(22) PCT Filed: Jul. 16, 2018

(86) PCT No.: PCT/EP2018/069296
§ 371 (c)(1),
(2) Date: Jan. 27, 2020

(87) PCT Pub. No.: WO2019/020424
PCT Pub. Date: Jan. 31, 2019

(65) Prior Publication Data
US 2021/0193875 A1 Jun. 24, 2021

(30) Foreign Application Priority Data
Jul. 28, 2017 (DE) .................... 10 2017 117 164.9

(51) Int. Cl.
H01L 33/38 (2010.01)
H01L 33/46 (2010.01)
(Continued)

(52) U.S. Cl.
CPC .......... H01L 33/382 (2013.01); H01L 33/005 (2013.01); H01L 33/0008 (2013.01);
(Continued)

(58) Field of Classification Search
CPC ....... H01L 33/005; H01L 33/14; H01L 33/62; H01L 33/0008; H01L 33/382; H01L 33/46; H01L 2933/0016; H01L 25/0753
See application file for complete search history.

(56) References Cited

U.S. PATENT DOCUMENTS 10,381,515 B2 * 8/2019 Kopp ................ H01L 33/145
10,446,717 B2 * 10/2019 Kopp ................ H01L 33/382
(Continued)

FOREIGN PATENT DOCUMENTS

DE 102009023849 A1 12/2010
DE 102015107577 A1 11/2016
(Continued)

OTHER PUBLICATIONS

German Search Report issued for corresponding DE application 10 2017 117 164.9, dated Apr. 23, 2018, 7 pages (for informational purpose only).
(Continued)

Primary Examiner — Savitri Mulpuri
(74) Attorney, Agent, or Firm — Viering, Jentschura & Partners MBB

(57) ABSTRACT

An optoelectronic semiconductor chip may include a semiconductor layer sequence having at least one n-doped semiconductor layer, at least one p-doped semiconductor layer, and an active layer arranged between the at least one n-doped semiconductor layer and the at least one p-doped semiconductor layer. A p-terminal contact may be electrically contacted to the p-doped semiconductor layer. An n-terminal contact may be electrically contacted to the n-doped semiconductor layer. The n-terminal contact may be arranged in direct contact with the p-doped semiconductor layer at least in regions.

17 Claims, 30 Drawing Sheets

(51) Int. Cl.
　　　H01L 33/14　　　(2010.01)
　　　H01L 33/00　　　(2010.01)
　　　H01L 33/62　　　(2010.01)
(52) U.S. Cl.
　　　CPC .............. *H01L 33/14* (2013.01); *H01L 33/46* (2013.01); *H01L 33/62* (2013.01); *H01L 2933/0016* (2013.01)

(56) References Cited

U.S. PATENT DOCUMENTS

| | | | |
|---|---|---|---|
| 10,777,708 B2 * | 9/2020 | Kopp | H01L 33/007 |
| 10,833,224 B2 * | 11/2020 | Kopp | H01L 33/387 |
| 2010/0155752 A1 | 6/2010 | Lim et al. | |
| 2010/0320489 A1 | 12/2010 | Epler | |
| 2012/0168809 A1 | 7/2012 | Maute et al. | |
| 2013/0134867 A1 | 5/2013 | Yang et al. | |
| 2017/0069794 A1 | 3/2017 | Kim | |
| 2018/0108811 A1 | 4/2018 | Kopp et al. | |

FOREIGN PATENT DOCUMENTS

| | | |
|---|---|---|
| EP | 3016151 A1 | 5/2016 |
| JP | 2005158788 A | 6/2005 |
| WO | 2016180779 A1 | 11/2016 |

OTHER PUBLICATIONS

International Search Report issued for corresponding PCT application PCT/EP2018/069296, dated Sep. 28, 2018, 15 pages (for informational purpose only).

* cited by examiner

A)

B)

C)

A)

B)

A)

B)

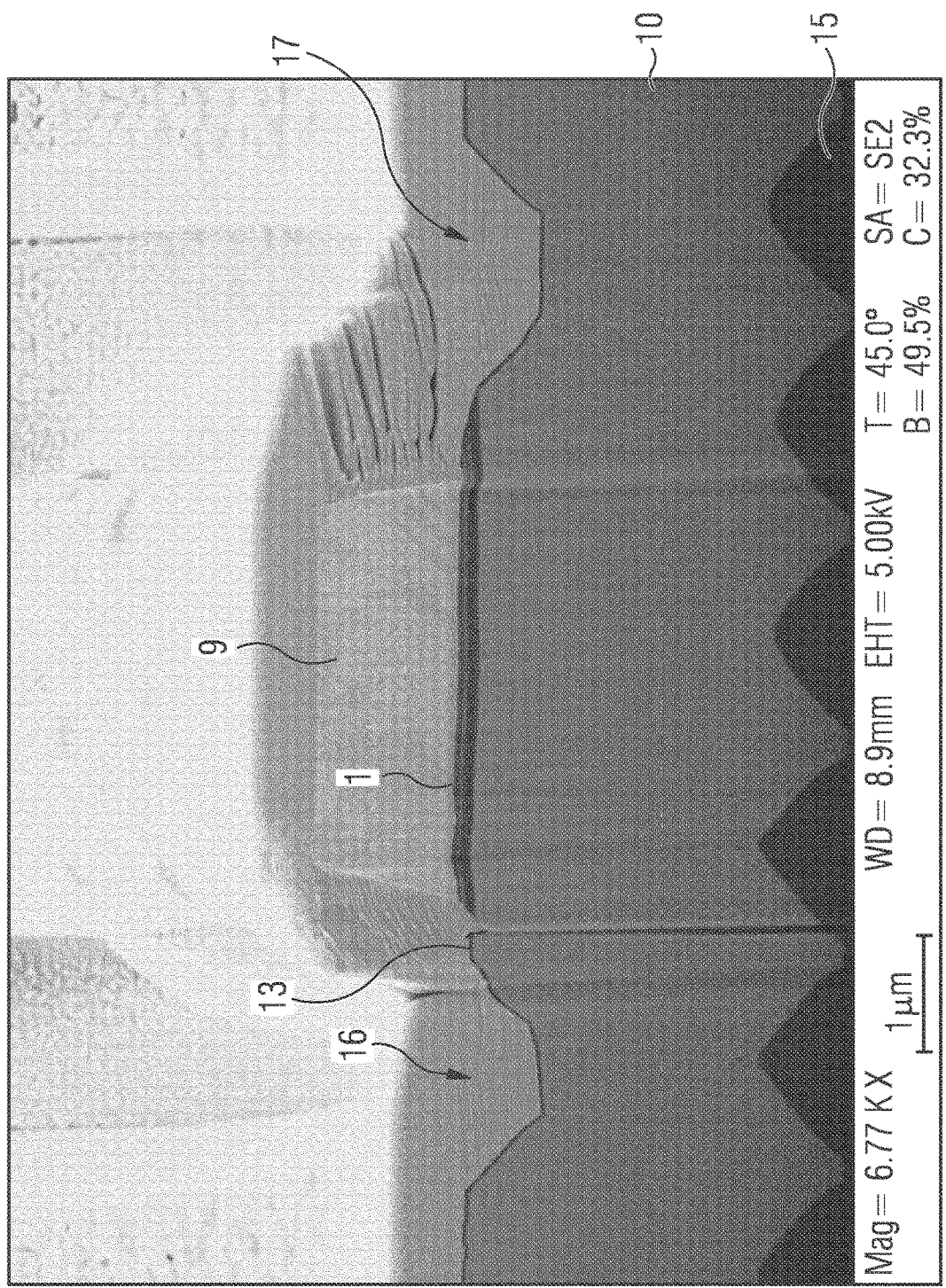

A)

B)

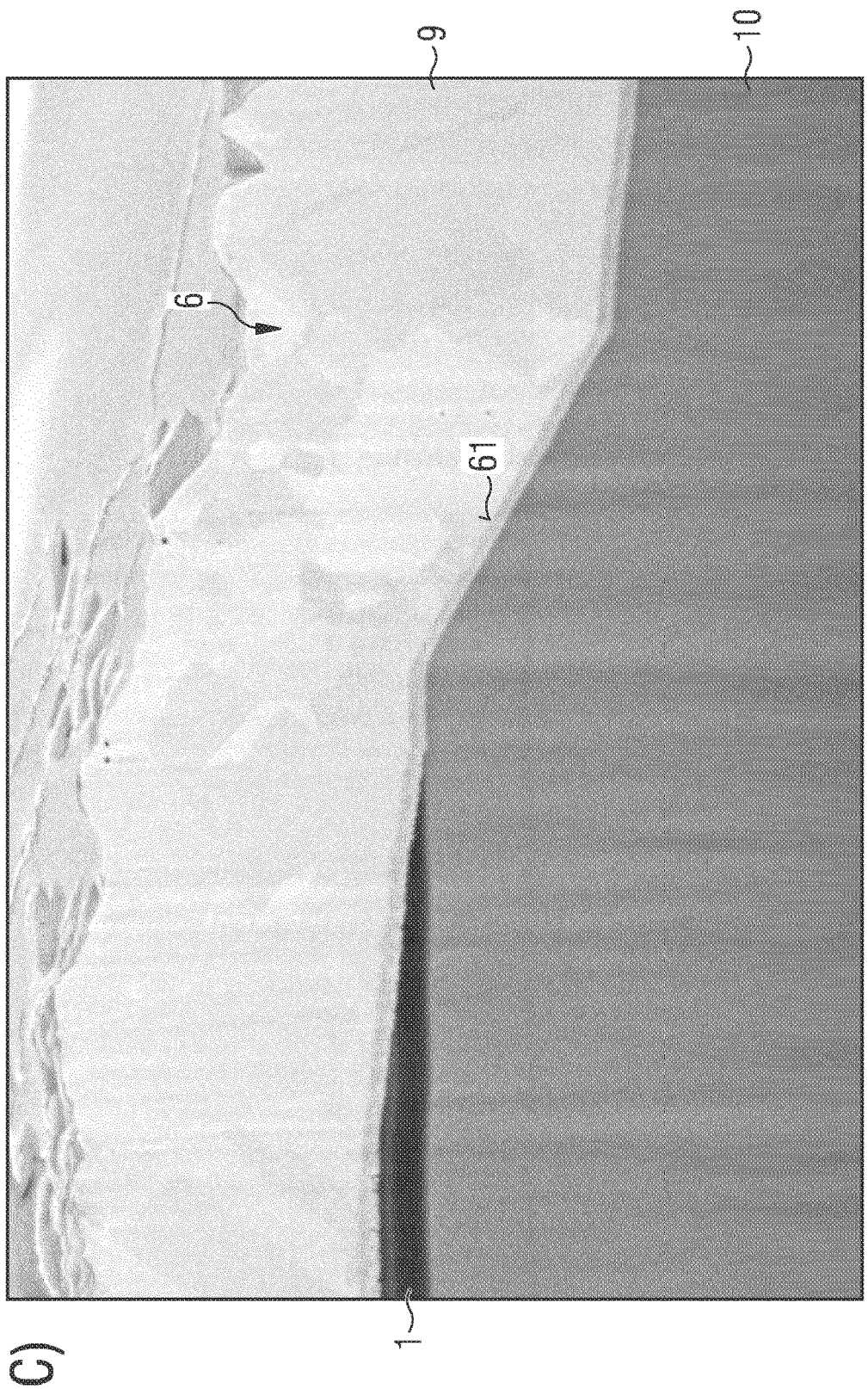

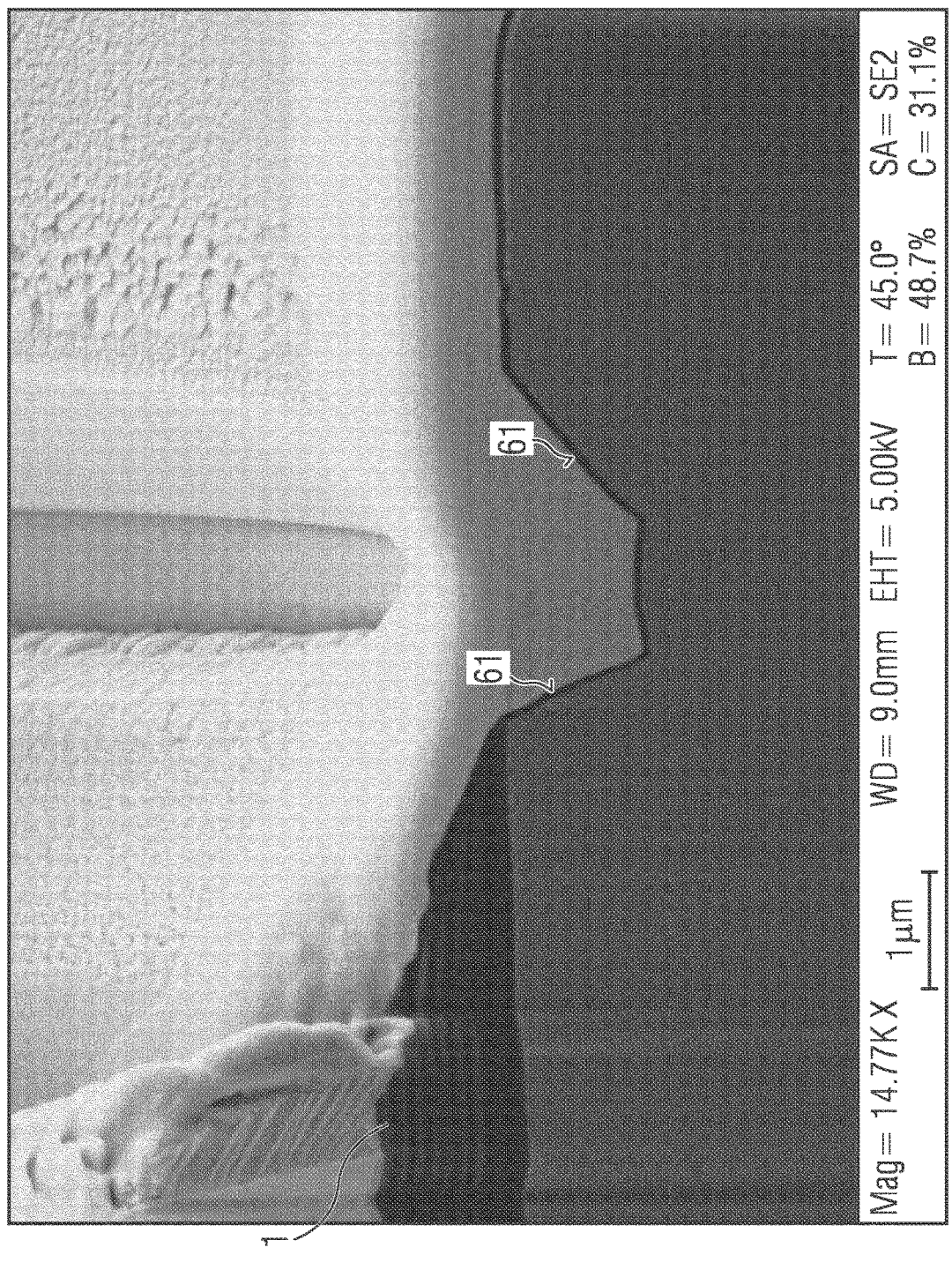

A)

B)

A)

B)

C)

D)

A)

B)

B)

A)

B)

A)

B)

A)

B)

A)

B)

B)

B)

A)

B)

D)

H)

A)

B)

C)

D)

OPTOELECTRONIC SEMICONDUCTOR CHIP, HIGH-VOLTAGE SEMICONDUCTOR CHIP AND METHOD FOR PRODUCING AN OPTOELECTRONIC SEMICONDUCTOR CHIP

CROSS-REFERENCE TO RELATED APPLICATIONS

The present application is a national stage entry according to 35 U.S.C. § 371 of PCT application No.: PCT/EP2018/069296 filed on Jul. 16, 2018; which claims priority to German Patent Application Serial No.: 10 2017 117 164.9, which was filed on Jul. 28, 2017; which is incorporated herein by reference in its entirety and for all purposes.

TECHNICAL FIELD

The invention relates to an optoelectronic semiconductor chip. The invention furthermore relates to a high-voltage semiconductor chip which includes, in particular, the optoelectronic semiconductor chip. The invention furthermore relates to a method for producing an optoelectronic semiconductor chip.

BACKGROUND

In optoelectronic semiconductor chips, for example LED chips, dielectric mirror elements may generally be applied below metallic terminal contacts in order to prevent a direct current flow into the semiconductor layer sequence. For example, an LED chip may be a sapphire volume emitter. The LED chip may emit blue or green light. Metallic terminal contacts, which inject a current into the semiconductor layer sequence, are generally applied on the upper side of the sapphire chip. Additional layers, for example dielectric mirror elements, may be arranged between the metallic terminal contacts and the semiconductor layer sequence. These additional layers may increase the reflection coefficient of the metallic terminal contacts. Generally speaking, the higher the reflection coefficient of the metallic terminal contacts, the lower the absorption per unit area of the metallic terminal contact. The brightness loss may thereby be reduced. However, the production of these additional layers between the metallic terminal contacts and the semiconductor layer sequences also entails further process outlay and therefore costs.

In addition or as an alternative to the dielectric mirror elements, transparent conductive layers, for example current spreading structures consisting of ITO, may also be applied between the metallic terminal contacts and the semiconductor layer sequence. These layers increase the reflection coefficient of the p- and/or n-terminal contacts.

SUMMARY

In a non-limiting embodiment, an optoelectronic semiconductor chip which has a high reflection and is produced economically. In another non-limiting embodiment, a method for producing an optoelectronic semiconductor chip, which produces the optoelectronic semiconductor chip favorably and rapidly.

It is furthermore an object to provide a high-voltage semiconductor chip which includes an optoelectronic semiconductor chip as described here and therefore has a high reflection and is produced economically.

In at least one embodiment, the optoelectronic semiconductor chip includes at least one semiconductor layer sequence. The semiconductor layer sequence includes at least one n-doped semiconductor layer and at least one p-doped semiconductor layer. An active layer is arranged between the at least one n-doped semiconductor layer and the at least one p-doped semiconductor layer. The p-doped semiconductor layer is electrically contacted by a p-terminal contact. The n-doped semiconductor layer is electrically contacted by an n-terminal contact. The n-terminal contact is arranged in direct contact with the p-doped semiconductor layer at least in regions, and/or the n-terminal contact is arranged in direct contact with a first trench and the active layer. Direct contact may in this case mean immediate contact, i.e. that no further layers or elements are arranged between the p-doped semiconductor layer and the n-terminal contact and/or the n-terminal contact and the first trench and the active layer.

A high-voltage semiconductor chip may include at least two optoelectronic semiconductor chips as described here.

A method for producing an optoelectronic semiconductor chip may include:

A) providing a semiconductor layer sequence having at least one first trench including at least one n-doped semiconductor layer, at least one p-doped semiconductor layer and an active layer arranged between the at least one n-doped semiconductor layer and the at least one p-doped semiconductor layer, A1) providing a first mirror element and etching a first trench, the first trench being adapted to receive an n-terminal contact which electrically contacts the n-doped semiconductor layer, B) applying the n-terminal contact at least in regions onto the n-doped semiconductor layer and onto the p-doped semiconductor layer, the n-terminal contact being arranged in direct contact with the p-doped semiconductor layer at least in regions and/or the n-terminal contact being arranged in direct contact with a first trench and the active layer.

According to at least one embodiment of the optoelectronic semiconductor chip, it includes at least one semiconductor layer sequence The semiconductor layer sequence has at least one n-doped semiconductor layer, at least one p-doped semiconductor layer and an active layer arranged between the at least one n-doped semiconductor layer and the at least one p-doped semiconductor layer. The semiconductor layers of the semiconductor chip are based on a III-V compound semiconductor material. The semiconductor material may be based on a nitride compound semiconductor material. In the present context, "based on a nitride compound semiconductor material" means that the semiconductor layer sequence or at least one layer thereof, includes a nitride compound semiconductor material, such as $In_xAl_yGa_{1-x-y}N$, where $0 \leq x \leq 1$, $0 \leq y \leq 1$ and $x+y \leq 1$. In this case, this material need not necessarily have a mathematically exact composition according to the formula above. Rather, it may include one or more dopants as well as additional constituents which do not substantially change the characteristic physical properties of the $In_xAl_yGa_{1-x-y}N$ material. For the sake of simplicity, however, the formula above only contains the essential constituents of the crystal lattice (In, Al, Ga, N), even though these may be partially replaced with small amounts of other materials.

According to at least one embodiment, the n-doped semiconductor layer is electrically contacted by an n-terminal contact. In other words, the n-terminal contact forms the n-contact of the optoelectronic semiconductor chip. The n-terminal contact may, for example, include a bond pad or one or more contact webs.

According to at least one embodiment, the p-doped semiconductor layer is electrically contacted by a p-terminal contact. In other words, the p-terminal contact forms the p-contact of the semiconductor chip. The p-terminal contact may, for example, include a bond pad or one or more contact webs.

The p-terminal contact may be arranged at least in regions inside a second trench or fully inside a second trench. The second trench may in this case be an indentation.

According to at least one embodiment, the n-terminal contact is metallic and/or is arranged at least in regions over the p-doped semiconductor layer and the n-doped semiconductor layer. As an alternative or in addition, the n-terminal contact and the p-doped semiconductor layer are electrically separated by a first dielectric mirror element except at least in one region of a first trench in which the n-terminal contact is arranged in direct contact with the p-doped semiconductor layer. Here and in what follows, direct contact may mean immediate mechanical and/or electrical contact.

The inventors have discovered that the n-terminal contact, which is arranged in particular inside a first trench, may be arranged at least in regions in direct electrical and/or mechanical contact with the p-doped semiconductor layer. In addition, the n-terminal contact may be arranged in direct contact with a first trench and the active layer. A longstanding preconception has therefore been overcome, according to which n-terminal contacts and p-doped semiconductor layers should not be arranged in immediate direct contact with one another, since a short circuit is otherwise produced. The inventors have discovered that this preconception may be overcome by an optoelectronic semiconductor chip as claimed in claim 1 and by a high-voltage semiconductor chip as claimed in claim 16 and a method as claimed in claim 17.

According to at least one embodiment, a first dielectric mirror element is arranged between the p-doped semiconductor layer and the n-terminal contact.

According to at least one embodiment, the first and/or second trench extends at least partially into the p-doped semiconductor layer. In particular, the first and/or second trench extends from the p-doped semiconductor layer over the active layer into the n-doped semiconductor layer. Here and in what follows, that the first and/or second trench extends at least partially into the corresponding semiconductor layer means that at least one subregion, in particular the bottom surface, of the trench protrudes into this corresponding semiconductor layer. In particular, the first and/or second trench may extend as far as a substrate on which the p-doped and n-dopes semiconductor layers are arranged. In particular, the first and/or second trench extends into the substrate. For example, the first and/or second trench extends up to at most 5 μm into the substrate. The second trench is, in particular, an indentation.

The first trench may have a depth greater than or equal to 50 nm and less than or equal to 15 μm. If the first trench extends into the n-doped semiconductor layer, the first trench may have a depth of from 100 nm to 3000 nm. If the first trench extends as far as the substrate, the first trench may have a depth of from 4 to 15 μm, for example 8 μm.

Here and in what follows, the second trench may be understood as a recess or indentation in the optoelectronic semiconductor chip, which has a width-to-length ratio of at least 1:5, in particular 1:15 or 1:30. Here and in what follows, the first trench may be understood as a recess in the optoelectronic semiconductor chip, which has a width of in particular between 5 μm and 20 μm and/or a length of between 100 μm and 700 μm. The first trench may have a width-to-length ratio of between 1:5 and 1:35, for example 1:20 or 1:35.

In particular, the first trench is a mesa trench, i.e. a trench etched more deeply, into the n-semiconductor layer.

According to at least one embodiment, the p-terminal contact and/or n-terminal contact has a maximum height in cross section. In particular, the p- and/or n-terminal contact is arranged inside the first trench to half of its maximum height, in particular up to ⅔ of its maximum height, in the corresponding trench. In other words, the n- and/or p-terminal contact protrudes out of the respective trench by at most one half to ⅓ of its maximum height. In particular, the p- and/or n-terminal contact is arranged fully inside the first trench. The effect of this is that the p- and/or n-terminal contact is concealed inside the first trench, and can therefore be protected against mechanical damage during production.

As an alternative, the p- and/or n-terminal contact may have a maximum height as seen in lateral cross section, the p- and/or n-terminal contact protruding beyond the first trench by up to at most ⅔ of this maximum height.

According to at least one embodiment, the n-terminal contact is arranged at least in regions or fully in direct electrical contact with the p-doped semiconductor layer.

According to at least one embodiment, the p-terminal contact and/or n-terminal contact is metallic. For example, the p-terminal contact and/or n-terminal contact is formed from gold. As an alternative, the p-terminal contact and/or n-terminal contact may include Ag, Cu, Rh, Al, Cr, Pd, Ti, Pt, W, Mo and/or TCO. TCO is, in particular, ITO and/or IZO (indium zinc oxide) and/or AZO (aluminum zinc oxide).

According to at least one embodiment, the semiconductor chip includes at least one first trench, the n-terminal contact extending inside the first trench, the n-terminal contact being arranged in direct mechanical contact with the p-doped semiconductor layer inside the first trench. This trench may also be referred to as a mesa trench.

According to at least one embodiment, the component includes a second dielectric mirror element. For the second dielectric mirror element, all comments and definitions as for the first dielectric mirror element apply, and vice versa. In particular, the first and/or second dielectric mirror element is configured as a distributed Bragg reflector (DBR). A DBR mirror may include a periodic sequence of layer pairs, which respectively include a first dielectric layer with a refractive index n1 and a second dielectric layer with a refractive index n2>n1. With this concept, the layer thickness of the first and/or second dielectric mirror element is not limited since overmolding of a subsequent transparent electrically conductive layer is noncritical. The first and/or second dielectric mirror element, optionally inclusive of a metal layer, such as has a reflectivity greater than or equal to 70%, alternatively greater than or equal to 90%, for example 95%.

According to at least one embodiment, the first and/or second dielectric mirror element includes at least one of the materials $Al_2O_3$, $Ta_2O_5$, $ZrO_2$, ZnO, $SiN_x$, $SiO_xN_y$, $SiO_2$, $TiO_2$, $ZrO_2$, $HfO_2$, $Nb_2O_5$, $MgF_2$ or combinations thereof.

According to at least one embodiment, the first dielectric mirror element and/or the second dielectric mirror element includes the same material or the same materials.

According to at least one embodiment, the first and/or second dielectric mirror element includes a layer sequence having alternating layers of $SiO_2$ and $TiO_2$ or $SiO_2$ and $Nb_2O_5$.

According to at least one embodiment, a direct current flow between the p-terminal contact or n-terminal contact and the p- and/or n-doped semiconductor layer sequences and the active layer is prevented by the first dielectric mirror element and/or the second dielectric mirror element. In other words, a direct current flow between the n-terminal contact and the semiconductor layer sequence is prevented by the first dielectric mirror element. A direct current flow between the p-terminal contact and the semiconductor layer sequence is prevented by the second dielectric mirror element.

According to at least one embodiment, the first trench includes a partial sidewall. The partial sidewall makes an angle a of less than 70°, such as less than 65°, in particular less than 60° or less than 45°, with the n-doped semiconductor layer.

According to at least one embodiment, a current spreading structure is arranged between the p-terminal contact and the first and/or second dielectric mirror element. The current spreading structure extends over the p-doped semiconductor layer and the first or second mirror element. A transparent conductive layer, such as of indium tin oxide (ITO,) may be used as the current spreading structure.

According to at least one embodiment, the first dielectric mirror element and/or the second dielectric mirror element includes at least three layers. The at least one first dielectric layer includes a first dielectric material with a refractive index n1. The at least second dielectric layer includes a second dielectric material with a refractive index n2>n1.

The first dielectric material advantageously has a low refractive index, such as n1≤1.7, and the second dielectric material has a high refractive index n2>1.7, alternatively n2>2. The first and/or second dielectric mirror element functions as an interference layer system, the reflection-increasing effect of which is based on multiple reflections at the interfaces between the dielectric layers with the different refractive indices n1, n2.

According to at least one advantageous configuration, the active layer is suitable for the emission of radiation with a dominant wavelength λ, with 0.01λ/4≤n1*d1≤10λ/4 applying for the thickness d1 of the at least one first dielectric layer and 0.01λ/4≤n2*d2≤10λ/4 applying for the thickness d2 of the at least one second dielectric layer. In a non-limiting embodiment, 0.5λ/4≤n1*d1≤5λ/4 and 0.5λ/4≤n2*d2≤5λ/4.

As an alternative, the first and/or second dielectric mirror element may include at least three layers, the at least first dielectric layer being the lowermost layer, i.e. that layer of the first and/or second dielectric mirror element which is arranged directly after the corresponding semiconductor layer. The following applies for the thickness d1 of the first dielectric layer: n1*d1=3λ/4 or n1*d1=5λ/4. For the subsequent layers, for example for the second dielectric layer, the following applies for the thickness d2: n2*d2=1λ/4.

In one non-limiting configuration, 0.7λ/4≤n1*d1≤1.3λ/4 applies for the thickness of the at least one first dielectric layer and 0.7λ/4≤n2*d2≤1.3λ/4 applies for the thickness of the at least one second dielectric layer. In this case, the optical thickness n1*d1 of the first dielectric layer and the optical thickness n1*d1 of the second dielectric layer are approximately equal to one fourth of the dominant wavelength. This is one possibility for achieving a high reflection by interference in the first and/or second dielectric mirror element.

The current spreading structure may be transparent for emitting radiation. The current spreading structure contains a transparent conductive oxide (TCO), for example ITO.

Transparent electrically conductive oxides (TCOs) are transparent electrically conductive materials, generally metal oxides, for example zinc oxide, tin oxide, cadmium oxide, titanium oxide, indium oxide, indium tin oxide (ITO) or aluminum zinc oxide (AZO). Besides binary metal-oxygen compounds, for example ZnO, $SnO_2$ or $In_2O_3$, ternary metal-oxygen compounds, for example $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and may also be p- or n-doped.

According to at least one embodiment, the first dielectric mirror element and the current spreading structure are respectively formed as a layer.

According to at least one further embodiment, the n-terminal contact is formed continuously, in particular in a simply connected fashion.

According to at least one embodiment, the first dielectric mirror element is formed in the shape of islands. Here and in what follows, this may mean in particular that the first dielectric mirror element forms different regions in a plan view of the semiconductor chip, which are arranged as a succession of strips, which in particular are arranged parallel to and at a distance from one another. As an alternative, this may mean that regions are present in which the first dielectric mirror element is in direct contact with the p-doped semiconductor layer.

As an alternative, the dielectric mirror element may be formed continuously. In particular, the dielectric mirror element may be formed in a simply connected fashion.

According to at least one embodiment, as seen in lateral cross section, the first and/or second dielectric mirror element has a smaller or larger lateral extent than the first trench and/or the second trench.

According to at least one embodiment, a further current spreading structure is arranged between the p-terminal contact and a second dielectric mirror element. For the further current spreading structure, the same definitions and comments apply as for the current spreading structure, and vice versa. The further current spreading structure extends, in particular, over the p-doped semiconductor layer and the second dielectric mirror element. The further current spreading structure is arranged between the second dielectric mirror element and the p-doped semiconductor layer.

According to at least one embodiment, a direct current flow between the p-terminal contact or n-terminal contact and the p- and n-doped semiconductor layer sequences and the active layer is prevented by the first and/or second dielectric mirror element.

According to at least one embodiment, a second dielectric mirror element is arranged between the p-terminal contact and the p-doped semiconductor layer. The current spreading structure is arranged over the p-doped semiconductor layer, the current spreading structure being at least in regions opened in the region of the p-terminal contact.

According to at least one embodiment, the n-terminal contact is arranged at least partially on the p-doped semiconductor layer, which in particular is formed from gallium nitride. The n-terminal contact and the p-doped semiconductor layer are electrically separated by at least one first and/or second dielectric mirror element except in the regions of a trench, i.e. of a mesa trench. In a non-limiting embodiment, the dielectric mirror element is formed as a highly reflective DBR.

The first and/or second dielectric mirror element is configured to be electrically insulating. In a non-limiting embodiment, the first and/or second dielectric mirror element includes at least one layer. The layer may have a refractive index of less than 1.7 or more than 1.7.

The layer thickness is in particular $\lambda/4$, it being possible for the first layer to have a layer thickness of $3\lambda/4$. A dielectric layer may additionally be applied on the first and/or second dielectric mirror element. This layer may be an etch stop layer or a sacrificial layer, which protects the first and/or second dielectric mirror element on the corresponding side surfaces of the first and/or second trench. For example, aluminum oxide may be applied as an etch stop layer with a layer thickness of for example more than 10 nm, and/or titanium dioxide as a sacrificial layer with a layer thickness of for example more than 100 nm.

According to at least one further embodiment, a current spreading layer may be arranged over the semiconductor layer sequence. The current spreading layer extends from the first dielectric mirror element into the first trench. Furthermore, the current spreading layer is in direct contact with the n-terminal contact, the first dielectric mirror element and in regions with the p-doped semiconductor layer as well as in regions with the n-doped semiconductor layer. The n-terminal contact is arranged on the current spreading layer. By the current spreading layer, the n-doped semiconductor layer is supplied with current via the n-terminal contact. The current spreading layer may be transparent for emitting radiation. The current spreading structure contains a transparent conductive oxide.

Transparent electrically conductive oxides (TCOs) are transparent electrically conductive materials, generally metal oxides, for example zinc oxide, tin oxide, cadmium oxide, titanium oxide, indium oxide, indium tin oxide (ITO) or aluminum zinc oxide (AZO). Besides binary metal-oxygen compounds, for example $ZnO$, $SnO_2$ or $In_2O_3$, ternary metal-oxygen compounds, for example $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and may also be p- or n-doped.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

FIGS. 2A to 4B, 5A and 5B, 6A and 6B, 7A to 7D, 8A and 8B, 9A to 17B respectively show a schematic side view or plan view of an optoelectronic semiconductor chip or component according to one embodiment.

DETAILED DESCRIPTION

Figure 1:
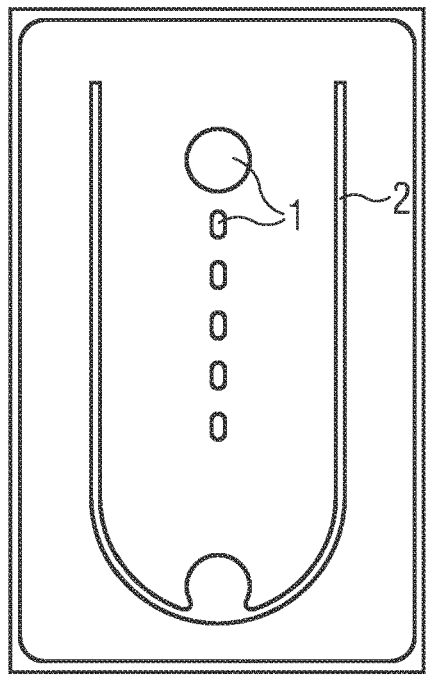
FIGS. 1A to 1C show a method for producing an optoelectronic component.
Figure 1:
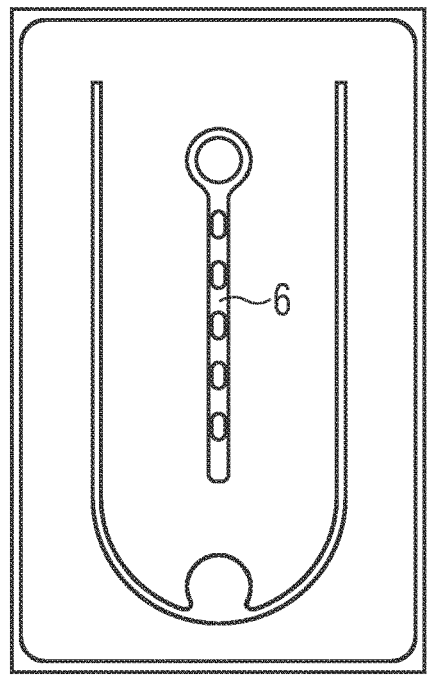
Figure 1:
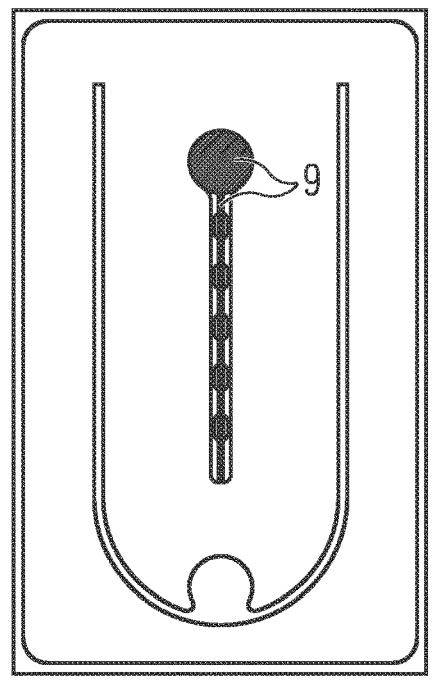

FIGS. 1A to 1C show a method for producing an optoelectronic component according to one embodiment.

A semiconductor layer sequence 10 is provided (not shown here). The semiconductor layer sequence includes at least one n-doped semiconductor layer 3, at least one p-doped semiconductor layer 5 and an active layer 4 arranged between the at least one n-doped semiconductor layer and the at least one p-doped semiconductor layer. A first dielectric mirror element 1 may be arranged on the semiconductor layer sequence. The first dielectric mirror element 1, in a plan view of the semiconductor layer, is arranged in the shape of islands and/or parallel to and at a distance from one another. Furthermore, a second dielectric mirror element 2 may be arranged on the semiconductor layer sequence. The second dielectric mirror element 2 is formed in a U shape in a plan view of the semiconductor chip.

According to the embodiment in connection with FIG. 1B, in a further step trenches are produced in the semiconductor layer sequence 10. The first trench 6 is adapted to receive an n-terminal contact 9. The first trench 6 is formed continuously, in particular in a multiply connected fashion, in a plan view of the semiconductor layer, and encloses the first dielectric mirror elements 1 fully. The second trench 7 may be an indentation in the second dielectric mirror element 2 and be adapted to receive a p-terminal contact 8.

According to at least one embodiment, the n-terminal contact has regions which are arranged in direct contact with the p-doped semiconductor layer, with the first trench, the active layer of the n-doped semiconductor layer and the first dielectric mirror element 1. In particular, the n-terminal contact is formed as a bond pad in an end region and is in direct contact with the p-doped semiconductor layer, the first trench, the active layer, the n-doped semiconductor layer and the first dielectric mirror element 1.

The first trench 6 may be produced in the semiconductor layer sequence 10 by lithography using a mask. The first trench 6 may be produced by an etching method. Subsequently, a current spreading structure 11 and/or further current spreading structure 12 may be applied (not shown here). In a non-limiting embodiment, the current spreading structure 11 is applied surface-wide, i.e. both in the first trench 6 and over the second dielectric mirror element 2. The current spreading structure 11 may subsequently be heated or annealed. In a non-limiting embodiment, the current spreading structure is formed from a TCO material such as ITO.

Subsequently, a further method step may be carried out. To this end, a mask for a further lithography step may be applied, and in particular a further trench may be produced inside the first trench 6. The production of the further trench may be carried out by an etching step. In this way, the current spreading structure 11 may be interrupted inside the first trench 6. The photoresist mask may be removed, and a passivation layer, for example of silicon dioxide, may optionally be applied (not shown here).

Subsequently, as shown in FIG. 1C, a lithography step may again be carried out. The passivation layer may be etched away in regions and the metallic terminal contacts, i.e. the n- and p-terminal contacts 8, 9 may be introduced into the corresponding trenches 6, 7. In the subsequent method step, the photoresist may be removed.

The application and curing of a current spreading structure 11 and/or of a further current spreading structure 12 may optionally be carried out in the corresponding steps.

Figure 2:
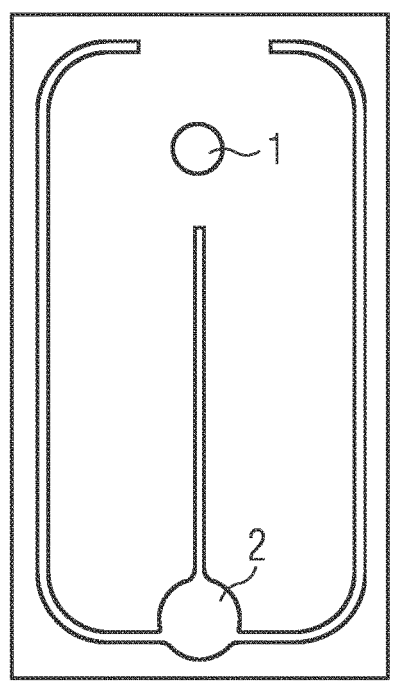
Figure 2:
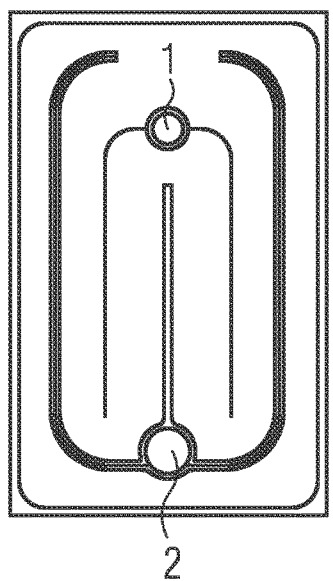
Figure 2:
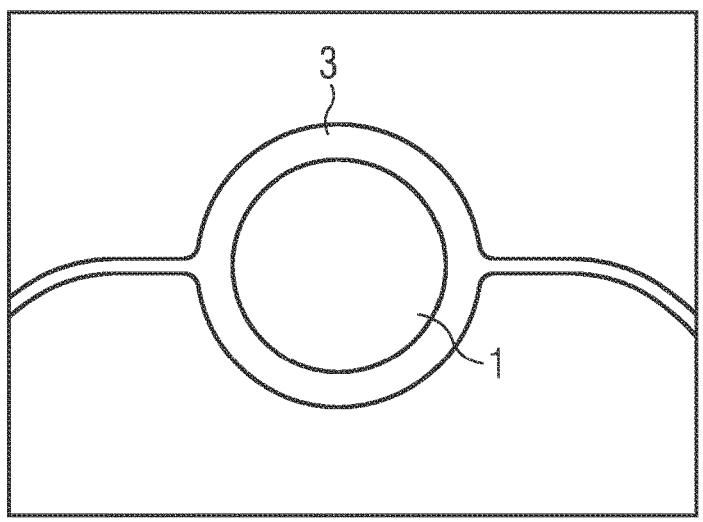

FIGS. 2A to 2C show a schematic plan view of a semiconductor chip according to one embodiment.

FIG. 2A shows a representation after application of a first dielectric mirror element 1 and of a second dielectric mirror element 2. In particular, the first dielectric mirror element 1 may be applied on the n-terminal contact 9, which in particular is formed as a bond pad.

FIGS. 2B and 2C respectively show a semiconductor chip after the trenches have been etched. Furthermore, the dielectric mirror element is still arranged in the region of the n-terminal contact. In addition, there are free regions of the n-terminal contact in the n-doped semiconductor layer sequence.

FIGS. 2A to 2C show the production of a three-layer semiconductor chip having a dielectric mirror element on the p- and n-terminal contacts. In particular, only the dielectric mirror element and only one trench are applied in the course of production. The brightness is increased because of application of a dielectric mirror element in the region of the n-terminal contact. No leakage current or ESD weakness are observable up to 4 kV through the n-terminal contact at the semijunction in the active region (pn junction).

Figure 3:
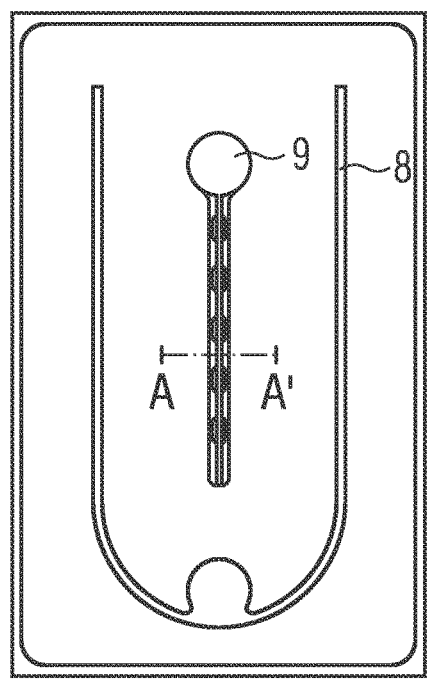
Figure 3:
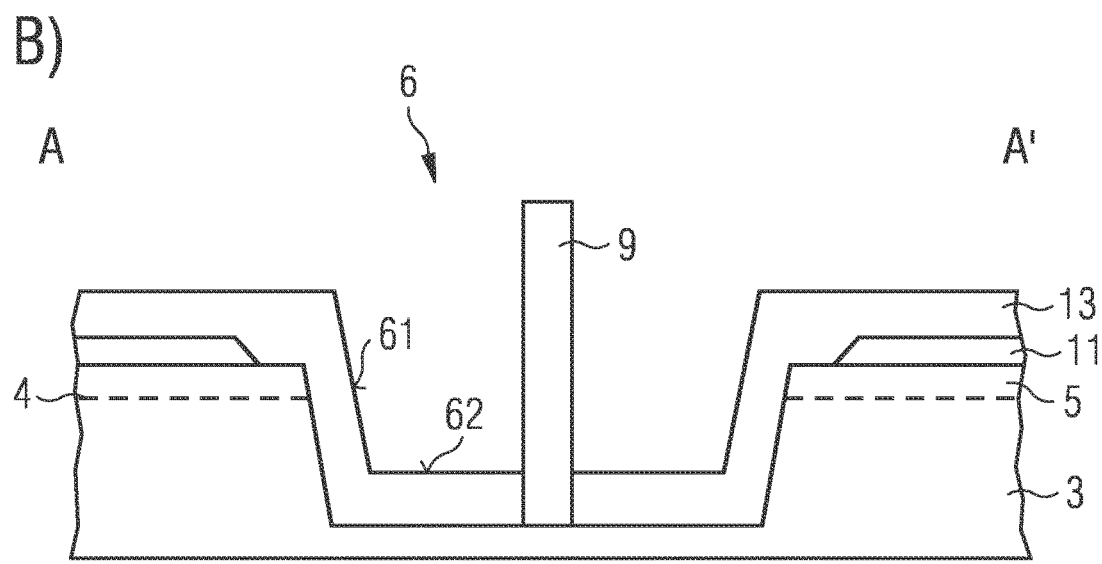

FIGS. 3A to 3B show an optoelectronic semiconductor chip according to one embodiment. FIG. 3A shows the plan view of the optoelectronic semiconductor chip, FIG. 3B shows the schematic side view in the sectional representation AA', the section AA' being located between two directly neighboring first mirror elements and extending perpendicularly to a main extent direction of the n-terminal contact. The main extent direction of the n-terminal contact is the direction along a maximum lateral extent of the n-terminal contact.

FIG. 3B shows a semiconductor layer sequence 10 having an n-doped semiconductor layer 3, in particular of n-GaN, a p-doped semiconductor layer 5, in particular of p-GaN, and an active layer 4 arranged between the two semiconductor layers 3, 5. The semiconductor layer sequence 10 includes a first trench 6. As shown in FIG. 3B, the first trench 6 extends into the n-doped semiconductor layer 3. The n-terminal contact 9 is arranged inside the first trench 6. The n-terminal contact 9 may protrude beyond the first trench 6 or be flush therewith. A current spreading structure 11 may be arranged over the semiconductor layer sequence 10. The current spreading structure 11 is formed from indium tin oxide. In a non-limiting embodiment, the current spreading structure 11 does not extend inside the first trench 6. A passivation layer 13, which is formed from silicon dioxide, may extend on the semiconductor layer sequence 10 and inside the first trench 6.

Here and in the other embodiments, the p-doped semiconductor layer 5 may be formed from p-GaN. Here and in the other embodiments, the n-doped semiconductor layer 3 may be formed from n-GaN. Here and in the other embodiments, the passivation layer 13 may be formed from silicon dioxide. Here and in the other embodiments, the current spreading structures 11, 12 may be formed from ITO. Here and in other embodiments, the p- and n-terminal contacts 8, 9 may include gold.

Figure 4:
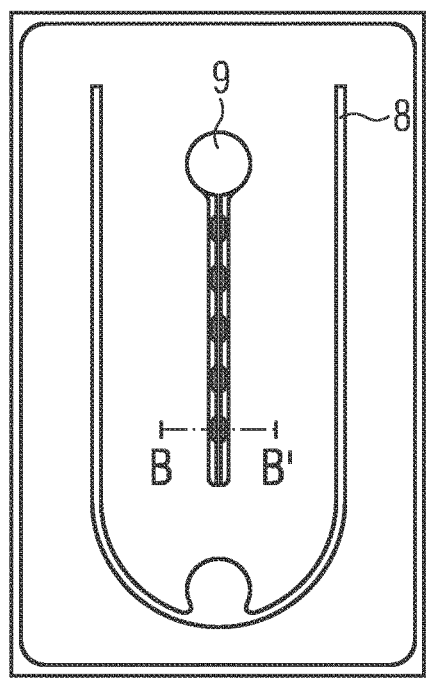
Figure 4:
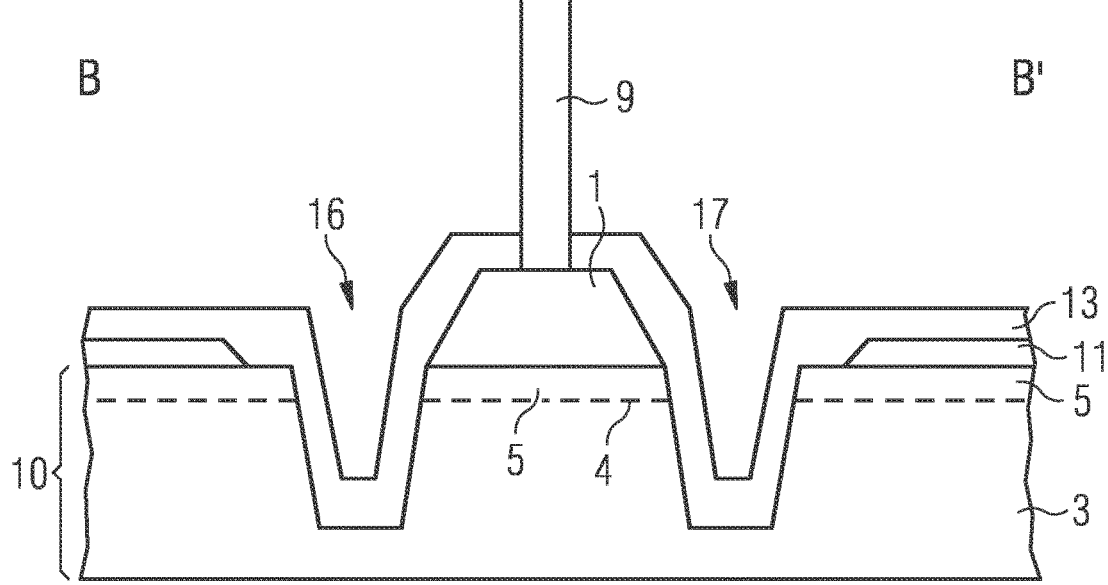

FIGS. 4A and 4B show a schematic plan view and a side view of a semiconductor chip 100 according to one embodiment. FIG. 4B shows the schematic side view in the sectional representation BB', and FIG. 4C shows the associated FIB (Focused Ion Beam) image according to the schematic side view of FIG. 4B. The section BB' is in this case located between two directly neighboring first trenches and intersects the first mirror element. Furthermore, the section BB' is perpendicular to the main extent direction of the n-terminal contact.

As shown in FIG. 4B, a semiconductor layer sequence 10 is represented. Two trenches 16 and 17 are shown inside the semiconductor layer sequence 10. The n-terminal contact 9 is arranged between the two trenches 16, 17. The n-terminal contact 9 is arranged on the p-doped semiconductor layer sequence 5 and the n-doped semiconductor layer 3. The n-terminal contact 9 is furthermore arranged on the active layer 4. A first dielectric mirror element 1 is arranged between at least the p-doped semiconductor layer 5 and the n-terminal contact 9. The first dielectric mirror element 1 may for example be formed from a dielectric such as $SiO_2$ or $TiO_2$, or multiple layers (DBR, Distributed Bragg Reflector). Furthermore, a passivation layer 13 may extend over the semiconductor layer sequence 10 inside the trenches 16, 17 and over the first dielectric mirror element 1.

According to FIG. 4C, a semiconductor layer sequence 10 is shown on a substrate 15. The substrate 15 may, for example, be a patterned sapphire substrate. Furthermore, the first dielectric mirror 1 may be arranged over the semiconductor layer sequence 10. The n-terminal contact 9 is arranged over the first dielectric mirror 1. Furthermore, the passivation layer 13 extends over the dielectric mirror element. Two trenches 16 and 17 are arranged on the left and right sides of the n-terminal contact 9.

Figure 5:
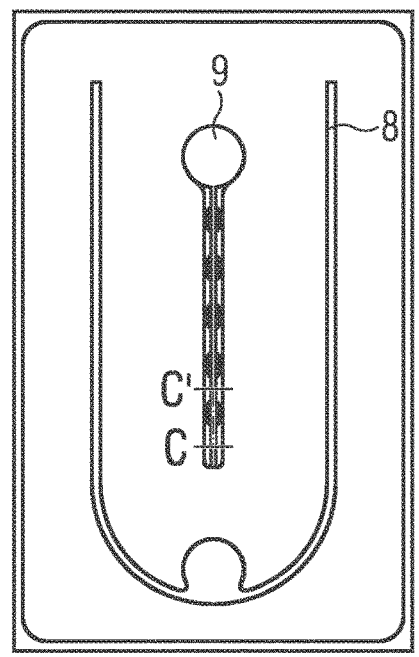
Figure 5:
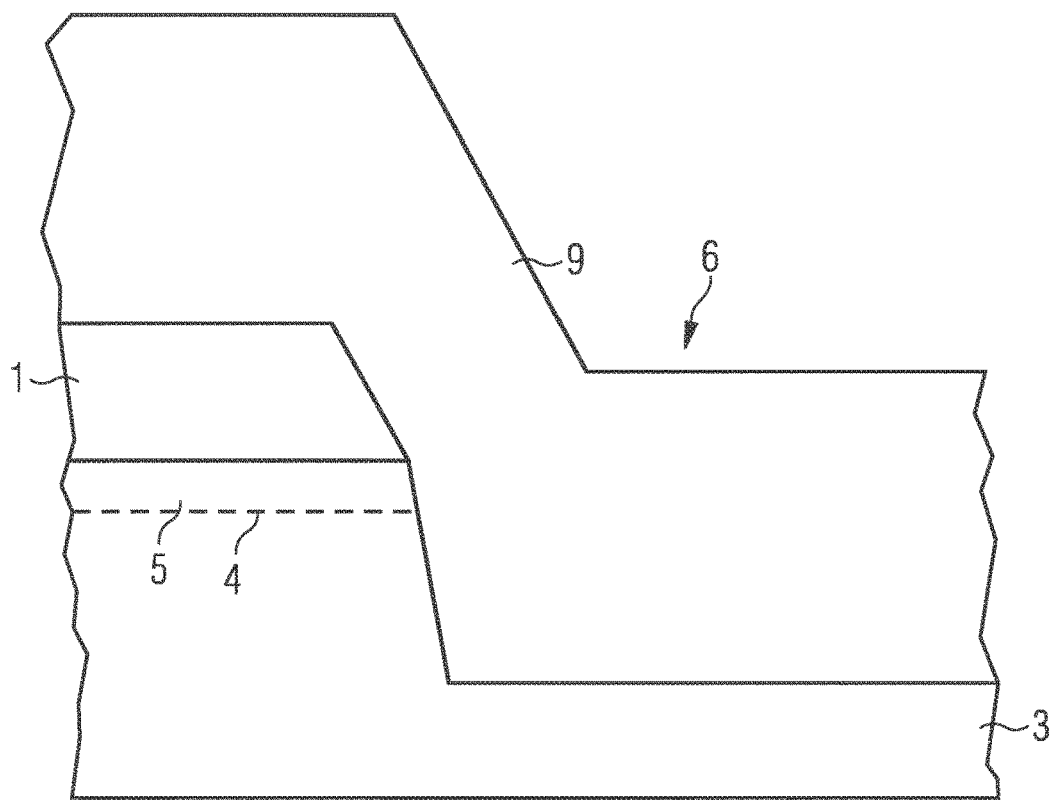
Figure 5:
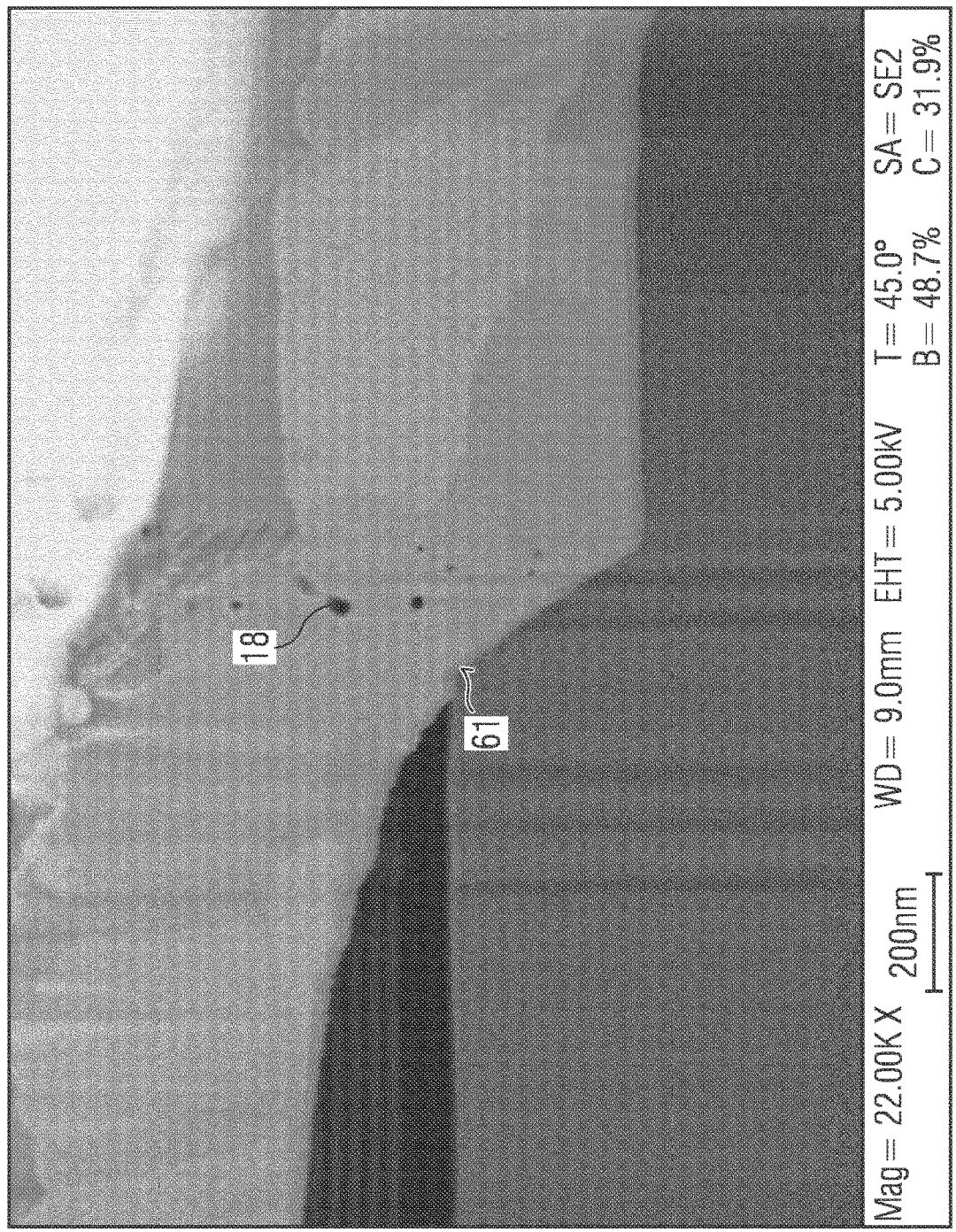
Figure 5:
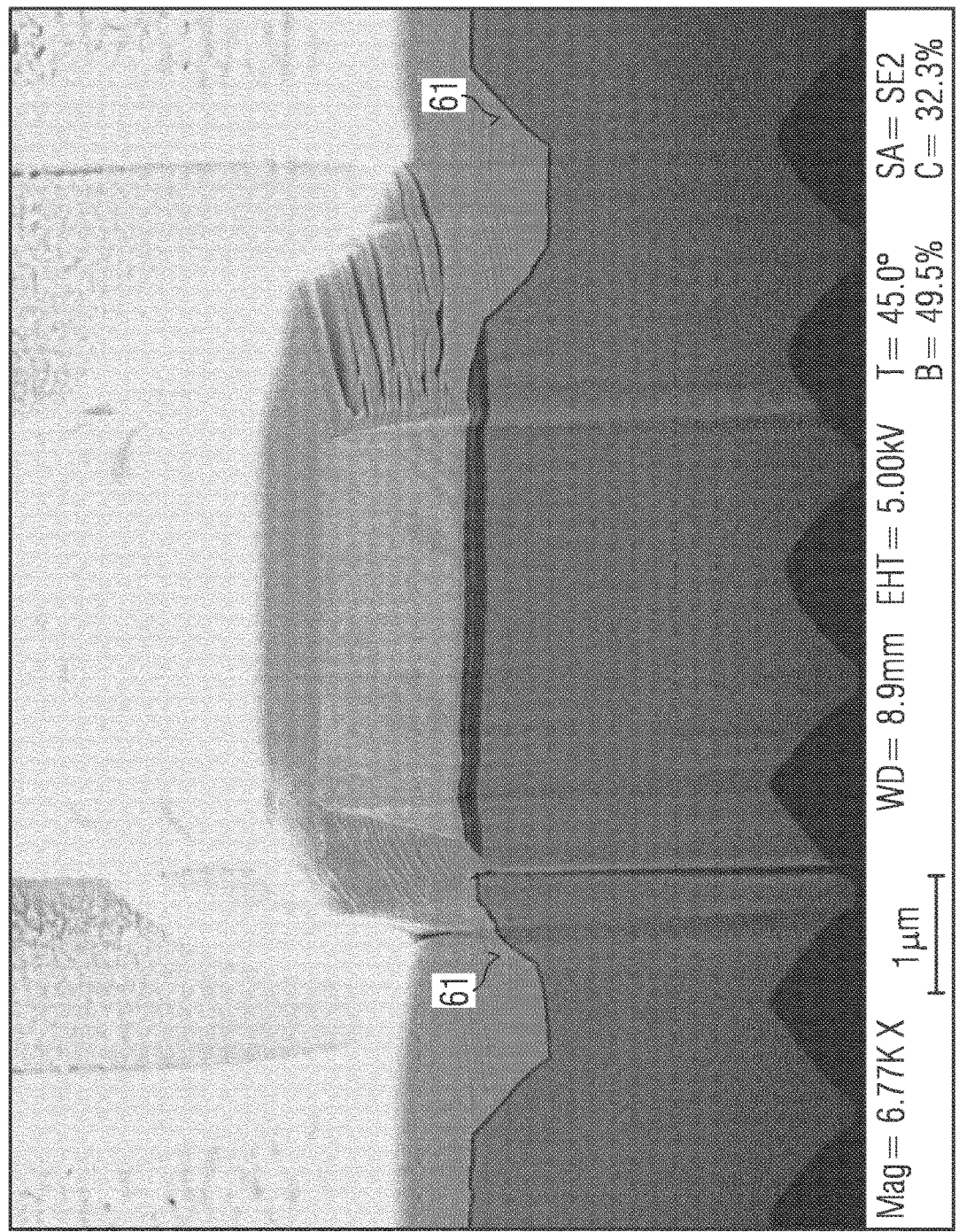

FIG. 5A shows a schematic plan view of a semiconductor chip 100 according to one embodiment. The semiconductor chip includes a section CC', which is schematically shown in FIG. 5B. The section CC' extends parallel to the main extent direction of the n-terminal contact, i.e. it intersects the first mirror element 1 and the first trench 1 parallel to the main extent direction of the n-terminal contact.

From this sectional representation CC', it can be seen that the n-terminal contact 9 extends over the first dielectric mirror element 1 of the p-doped semiconductor layer 5, of the active layer 4 and/or of the n-doped semiconductor layer 3. Furthermore, the n-terminal contact 9 includes a direct electrical and/or mechanical contact with the p-doped semiconductor layer 5 inside the first trench 6, without producing a short circuit. In other words, no insulation is present between the p-doped semiconductor layer 5 and the n-terminal contact 9. The n-terminal contact 9 overmolds the first trench 6, in particular the partial sidewalls of the first trench, which may also be referred to as mesa edges, as well as the first dielectric mirror element 1. Although the n-terminal contact 9 is made of metal and is in direct contact with the n-doped semiconductor layer 3 as well as with the p-doped semiconductor layer 5, no short circuit or ESD weakness is produced.

The first dielectric mirror element 1 is arranged on the surface of the p-doped semiconductor layer 5. The n-terminal contact 9 is arranged thereon. This leads to an n-terminal contact 9 which is in direct contact with the pn junction. The experimental data show that the first dielectric mirror element 1 increases the brightness and a short circuit is not created, so that the semiconductor chip is stable against electrostatic discharges (ESD).

The sectional representation AA' of FIG. 3A shows in comparison the application of the n-terminal contact 9 without a first dielectric mirror element 1. The n-terminal contact is in direct contact with the n-doped semiconductor layer 3. The sectional representation BB' in FIG. 4A shows in comparison the n-terminal contact 9 which is arranged on the first dielectric mirror element 1 as well as on the p-doped semiconductor layer 5. The first dielectric mirror element 1 is applied by lithographic mask. The first dielectric mirror element 1 is configured to be insulating. The dielectric mirror element 1 consists of a highly reflective DBR (Distributed Bragg Reflector). The Bragg reflector includes a layer sequence of alternating layers with different refractive indices. Layers with a low refractive index (n<1.7) and high refractive index (n>1.7) are to be selected. The layer thickness is in particular $\lambda/4$, the first layer having a thickness of $3\lambda/4$. A dielectric layer may additionally be applied on the upper side of the first dielectric mirror element 1. This layer may be used as an etch stop layer or sacrificial layer, which protects the first dielectric mirror element 1 in the region of the first trench 6. For example, aluminum oxide may be used as an etch stop layer with a thickness of more than 10 nm, or titanium dioxide as a sacrificial layer with a thickness of more than 100 nm. The first dielectric mirror element 1 increases the reflection coefficient of the metallic n-terminal contact 9 and therefore reduces the light absorption. Two trenches may be arranged laterally with respect to the n-terminal contact 9. These trenches insulate the pn junction. The sectional representation CC' in FIG. 5A shows a lateral cross section of the n-terminal contact along the first dielectric mirror element 1. The first trench 6 and the first dielectric mirror element 1 are overmolded by the n-terminal contact 9.

FIG. 5C shows the associated FIB image with the side surface 61 of the first trench 6. In this case, the n-terminal contact 9 thus extends directly over the first dielectric mirror element 1, the p-doped semiconductor layer 5 and the n-doped semiconductor layer 3. No short circuit or the like is produced in this case.

FIG. 5C shows a thinly configured dielectric mirror element as a layer stack or DBR having few layers, i.e. for example three layers. This leads to an etch-back of ~200 nm during the mesa etching. As a result, a flat mesa edge 61 is obtained.

FIG. 5D shows a configured dielectric mirror element as a layer stack or DBR having many layers, i.e. for example 15 layers. This leads to deep or steep mesa edges 61. The steep mesa angle produces holes in the Au current spreader 18.

FIG. 5E shows a thinly configured dielectric mirror element as a layer stack or DBR having few layers, i.e. for example three layers. This leads to an etch-back of ~200 nm during the mesa etching. As a result, a flat mesa edge 61 is obtained. In this example, the mesa edge of the dielectric mirror element is flatter than the other mesa edge, which is formed by a resist mask.

FIG. 5F shows that the mesa angle depends on the dielectric mirror element (layer stack). A DBR of 15 layers consisting of $SiO_2$ (dark layer) and $TiO_2$ (light layer) causes a steep mesa edge. In this example, the mesa edge of the dielectric mirror element is steeper than the other mesa edge, which is formed by a resist mask.

Figure 6:
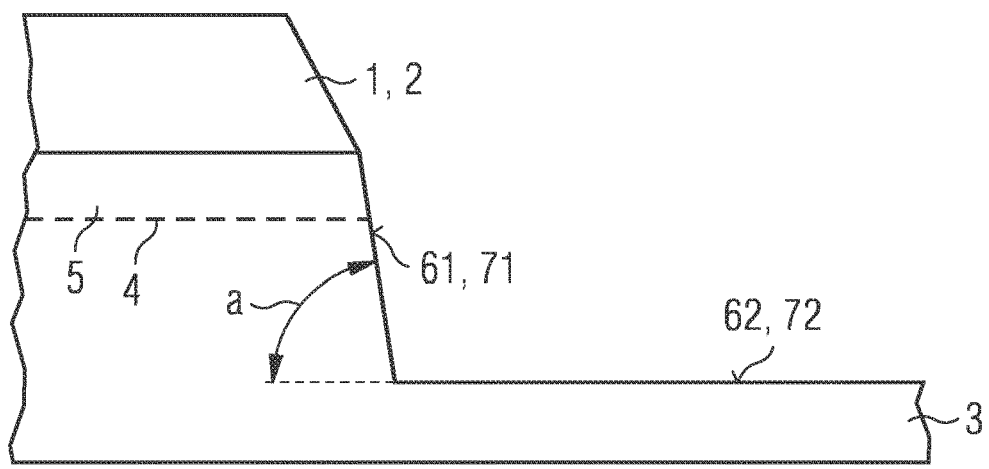
Figure 6:
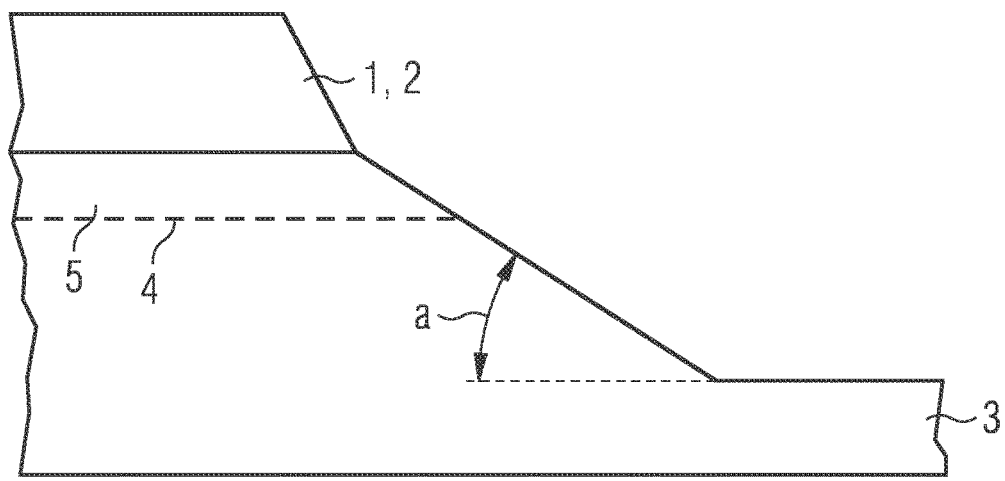

FIGS. 6A and 6B show a schematic side view of a semiconductor chip 100 according to one embodiment. The two figures show an n-doped semiconductor layer 3, on which the active layer and the p-doped semiconductor layer 5 and the corresponding dielectric mirror elements 1, 2 are arranged.

FIGS. 6A and 6B differ by the angle a which the first trench 6 and/or the second trench 7 have. The first and/or second trench 6, 7 may respectively include a partial sidewall 61, 71. The partial sidewall 61, 71 has an angle a with the n-doped semiconductor layer 3 of less than 70°, such as less than 65° or less than 60°, or alternatively less than 45°. The thickness of the metallic n-terminal contact 9 is reduced by the topology at the partial sidewalls and with the angle a. For this reason, the current distribution of the current transfer along the trenches 1, 2, as is defined by Ohm's law, can be significantly increased.

In a non-limiting embodiment, the partial sidewall 61, 71 extends from the p-doped semiconductor layer 5 into the n-doped semiconductor layer 3. The trench 6, 7 may also include different partial sidewalls with different angles. For example, the trench 6, 7 may have an angle laterally with respect to the corresponding dielectric mirror element 1, 2 which is different to the angle a.

FIGS. 7A to 7D show a plan view of a first trench 6 of an optoelectronic semiconductor chip 100 according to one embodiment.

In this case, different variants of the n-terminal contact 9 are shown. The n-terminal contact 9 may have a smaller lateral extent than the first dielectric mirror element 1 as seen in plan view (FIG. 7A).

Figure 7:
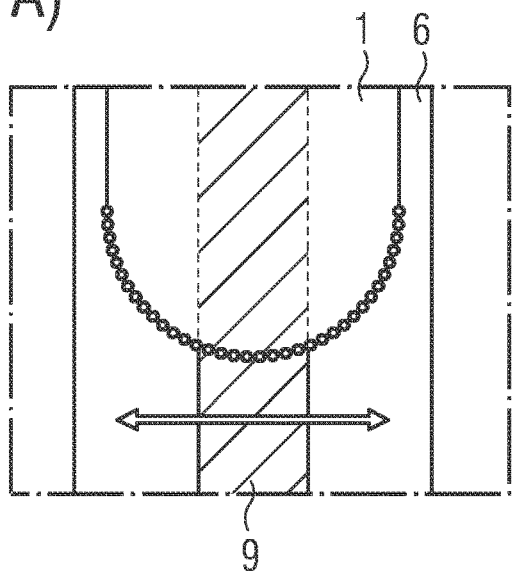
Figure 7:
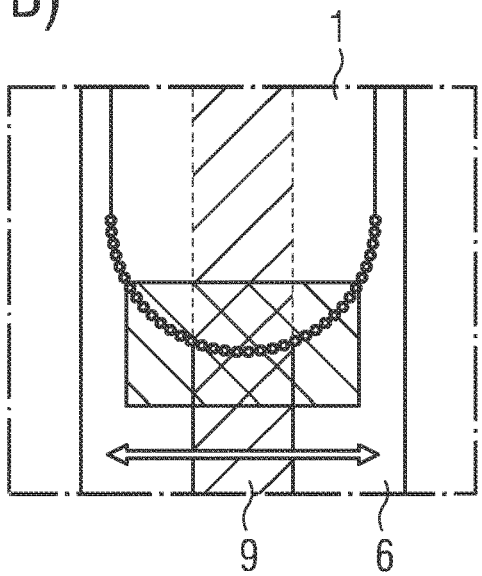
Figure 7:
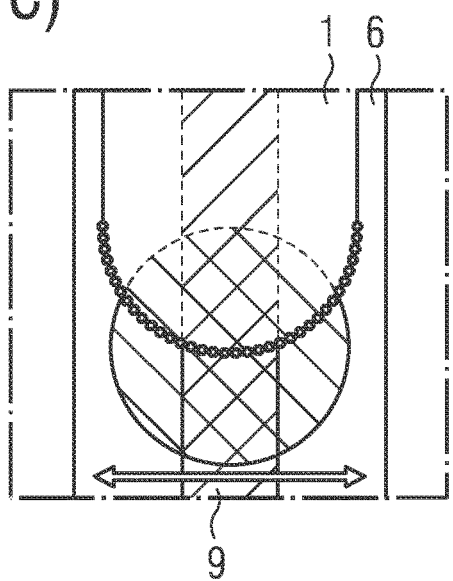
Figure 7:
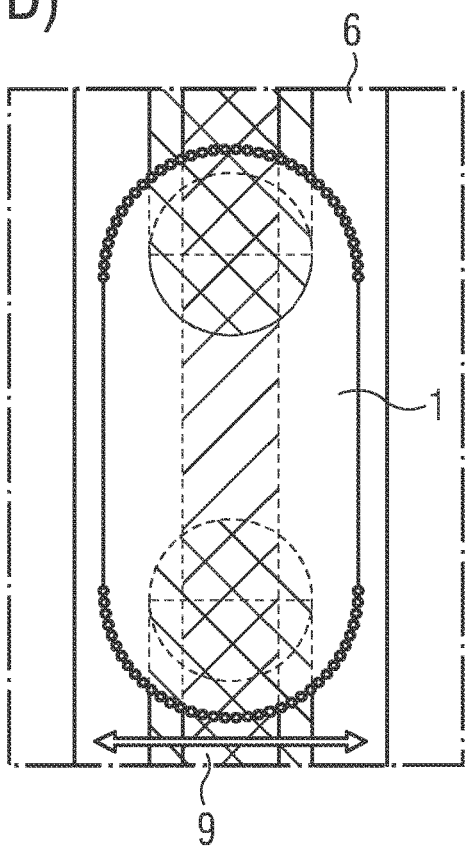

In FIG. 7B, it is shown that the n-terminal contact 9 may be configured rectangularly and have an approximately equal lateral extent to that of the first dielectric mirror element 1.

FIG. 7C shows a round configuration of the n-terminal contact 9, which overlaps with the first dielectric mirror element at least in subregions. The first dielectric mirror element 1 and the n-terminal contact 9 may have an equal lateral extent. Instead of widening of the n-terminal contact 9, it may also be tapered above the first dielectric mirror element 1 (FIG. 7D).

FIG. 7A shows the reference with a constant width of the n-terminal contact 9 along the first trench 6 and along the first dielectric mirror element 1. FIGS. 7B and 7C show a different configuration of the n-terminal contact 9 rectangularly (FIG. 7B) and circularly (FIG. 7C). The shape of the n-terminal contact 9 increases the cross section in the region of the first trench 6 and therefore compensates for the reduced current distribution thickness in the region of the topology which is produced in the region of the angle a. In addition, the n-terminal contact 9 may be reduced on the first dielectric mirror element 1 (FIG. 7D) because the n-terminal contact 9 has no contact with the n-doped semiconductor layer 3 and is therefore electrically insulated.

Figure 8:
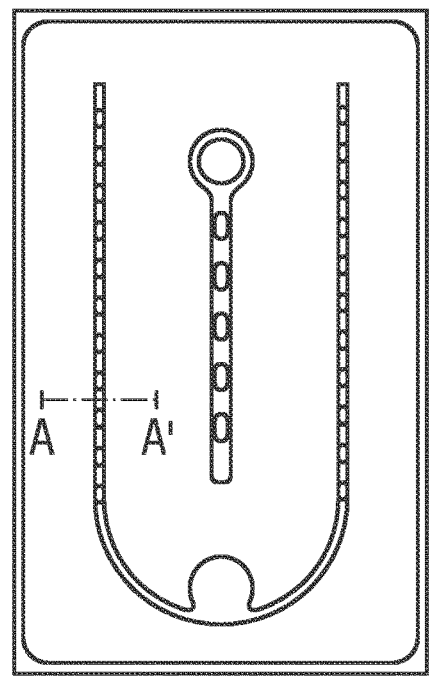
Figure 8:
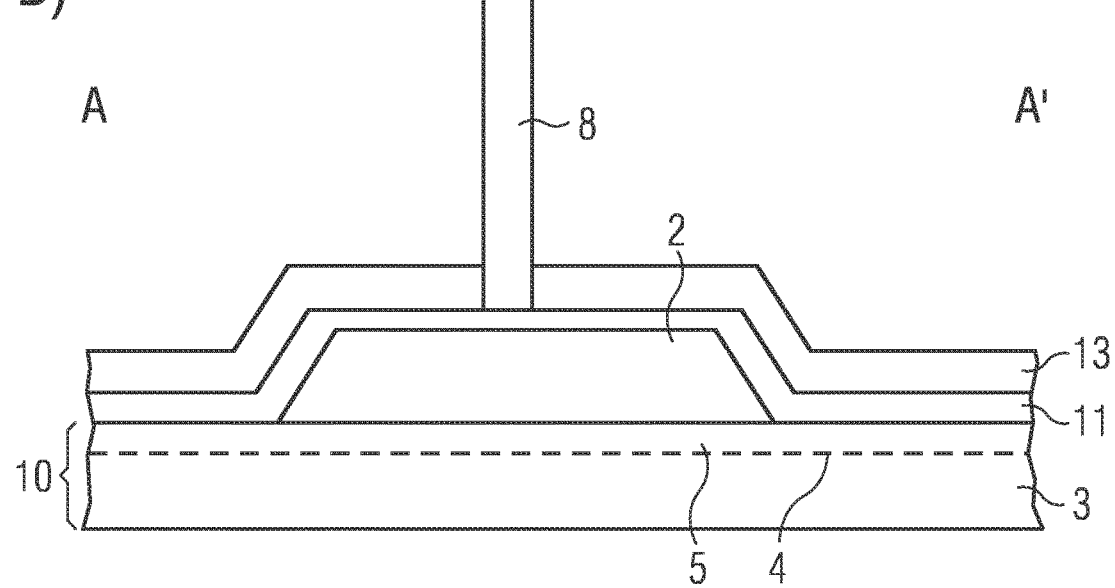

FIG. 8A shows a schematic plan view with a sectional representation AA' of a semiconductor chip 100 according to one embodiment, and FIG. 8B shows a schematic side view of the sectional representation AA'.

The semiconductor layer sequence 10 with the n-doped semiconductor layer 3, the active layer 4 and the p-doped semiconductor layer 5 is shown. A second dielectric mirror element 2 is arranged on the p-doped semiconductor layer 5. Arranged over the second dielectric mirror element 2, there is a current spreading structure 11, for example of ITO, which extends over the semiconductor layer sequence 10. The p-terminal contact 8 is arranged over the second dielectric mirror element 2. Furthermore, a passivation layer 13, in particular of silicon dioxide, extends over the semiconductor layer sequence 10.

Figure 9:
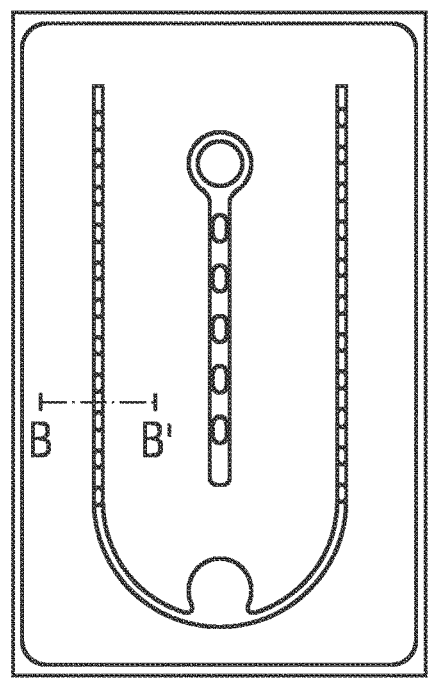
Figure 9:
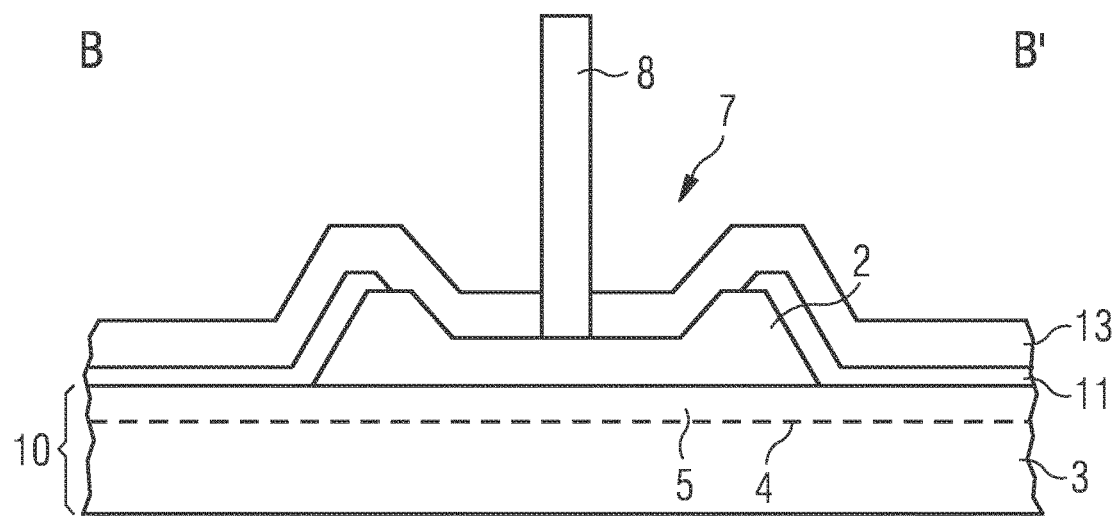

FIGS. 9A and 9B show a schematic plan view of a semiconductor chip 100 with the section BB' and a schematic side view of the sectional representation BB'.

The semiconductor chip 100 includes a semiconductor layer sequence 10. A dielectric mirror 2 is applied on the semiconductor layer sequence 10. The p-terminal contact 8 is arranged in direct contact on the second dielectric mirror 2. The semiconductor chip furthermore includes a passivation layer 13 and a current spreading layer 11. The current spreading structure 11 is opened in the region of the p-terminal contact 8. This opening may be carried out by etching. The adhesion may therefore be improved, since for example mechanical adhesion between the current spreading structure 11 and the p-terminal contact 8 may not be very good. FIG. 8B thus shows a p-terminal contact 8 without an opening of the current spreading structure 11. FIG. 9B shows the opening of the current spreading structure 11. The opened regions of the current spreading structure 11 are produced inside the second trench 7 during the etching process. They are produced directly on the second dielectric mirror element 2 and separate the metallic p-terminal contact 8 from the current spreading structure 11. On the basis of this property, the current flows along the p-terminal contact 8 to the current spreading structure 11 as a result of the reduced contact area, which may be produced from a more homogeneous current density distribution on the semiconductor chip surface or in the active region. The brightness may therefore be increased by the opening of the current spreading structure 11.

Figure 10:
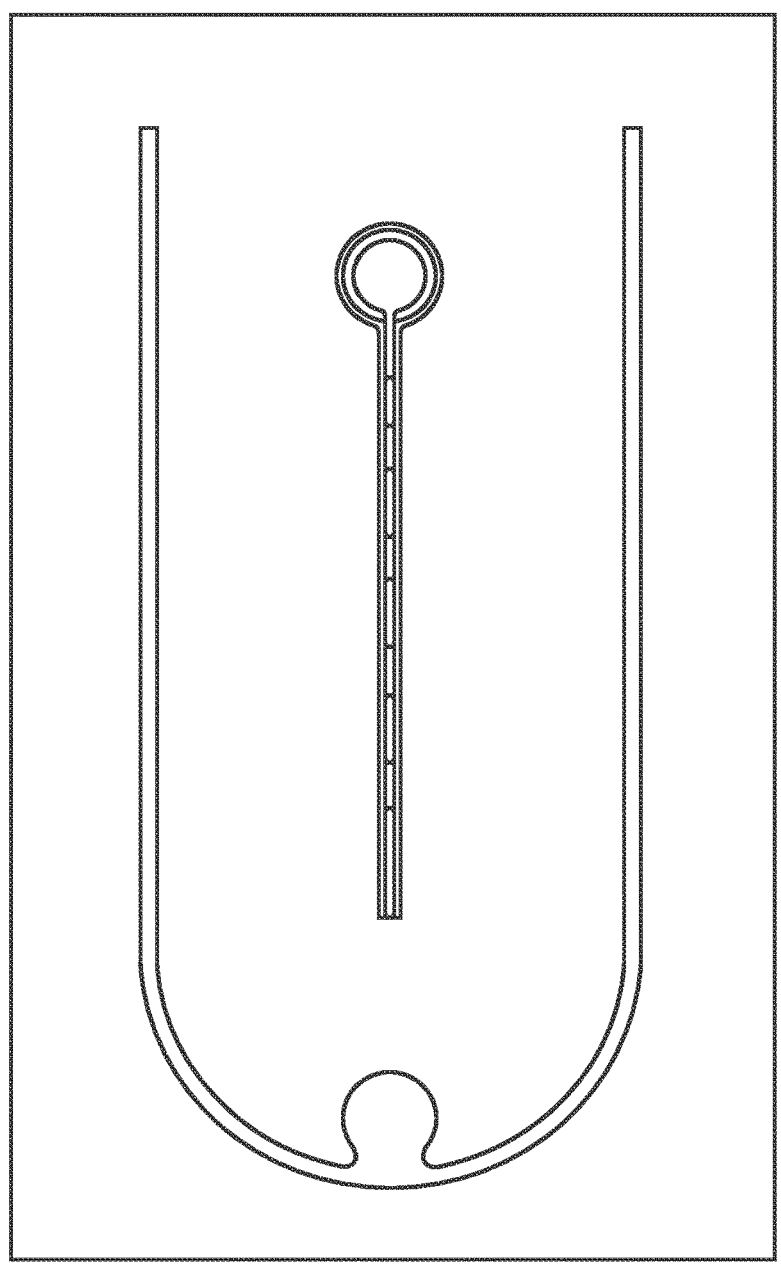
Figure 10:
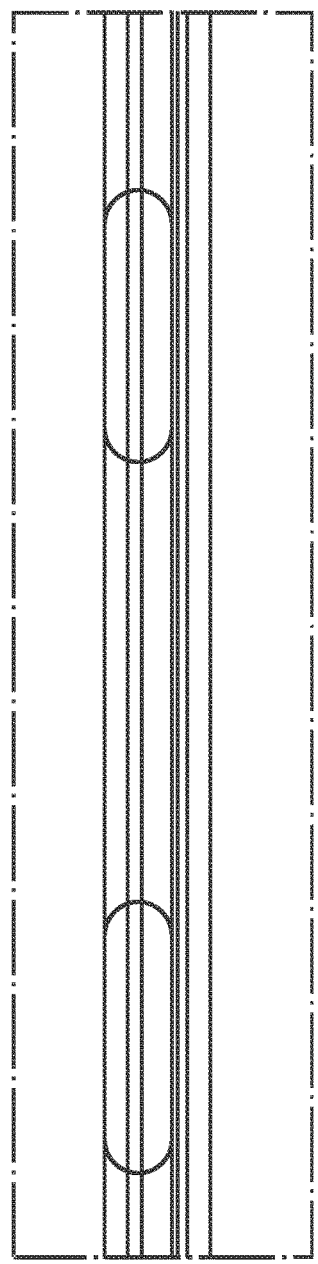

FIGS. 10A and 10B respectively show a photographic image of a semiconductor chip 100 according to one embodiment. The opening of the current spreading structure 11 in the region of the p-terminal contact 8 is shown in FIG. 10B. The adhesion of the metallic p-terminal contact is thereby increased. A corresponding opening in the p-bond pad reduces the risk of bond pad peeling.

Figure 11:
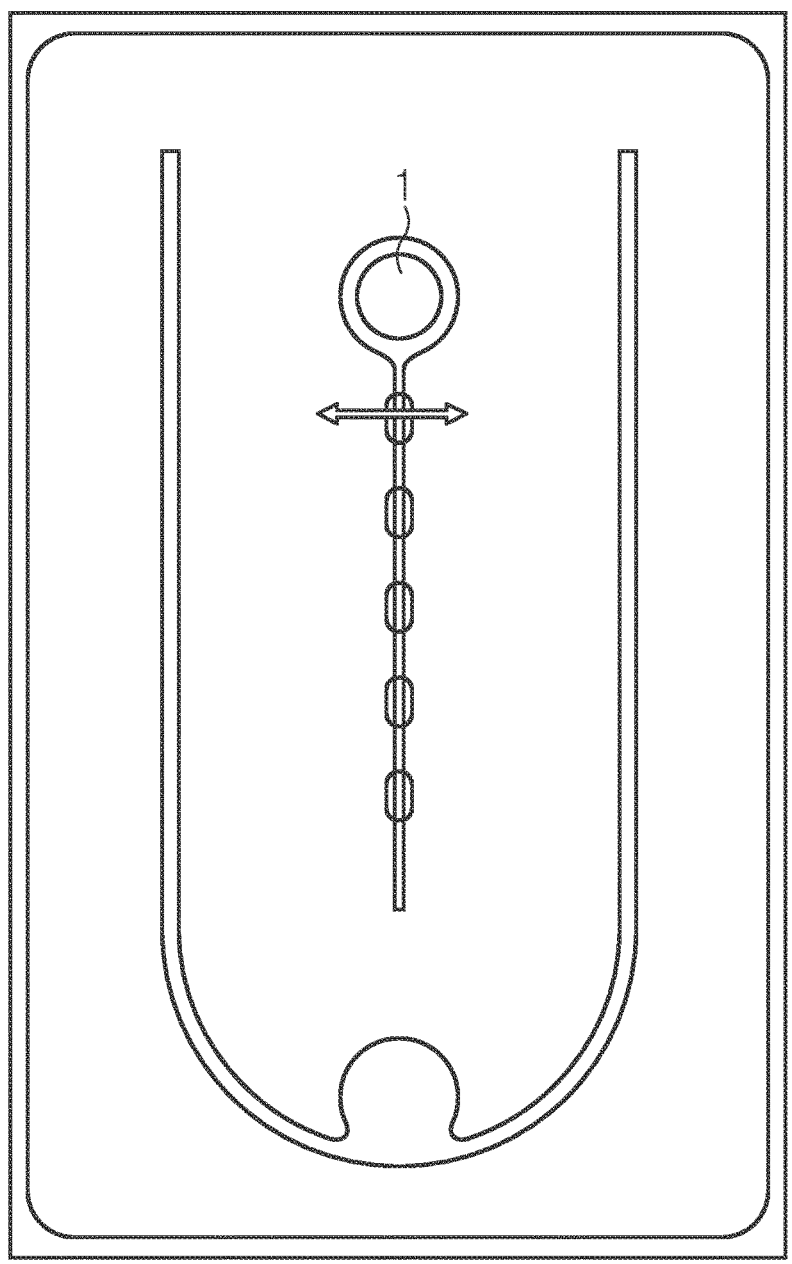
Figure 11:
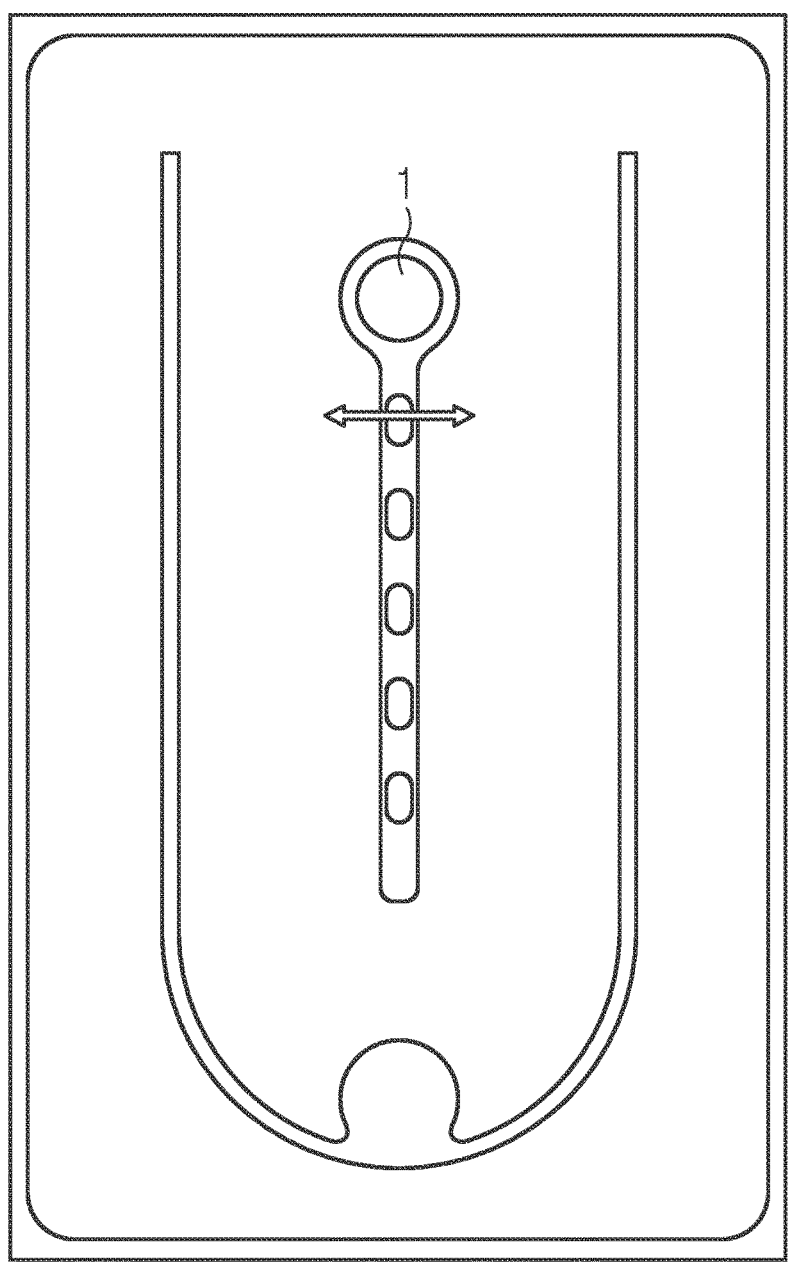

FIGS. 11A and 11B respectively show a plan view of an optoelectronic semiconductor chip according to one embodiment. In FIG. 11A, the first trench 6 is configured to be smaller than the lateral extent of the first dielectric mirror element 1.

In FIG. 11B, the lateral extent is precisely the other way around. In other words, in FIG. 11B the lateral extent of the first dielectric mirror element 1 is greater than the lateral extent of the first trench 6.

Figure 12:
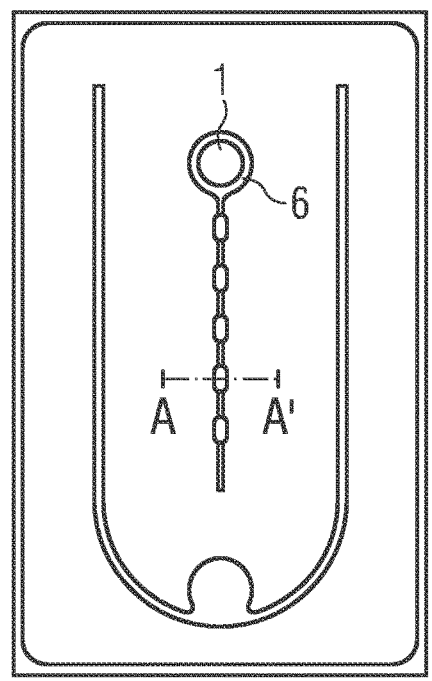
Figure 12:
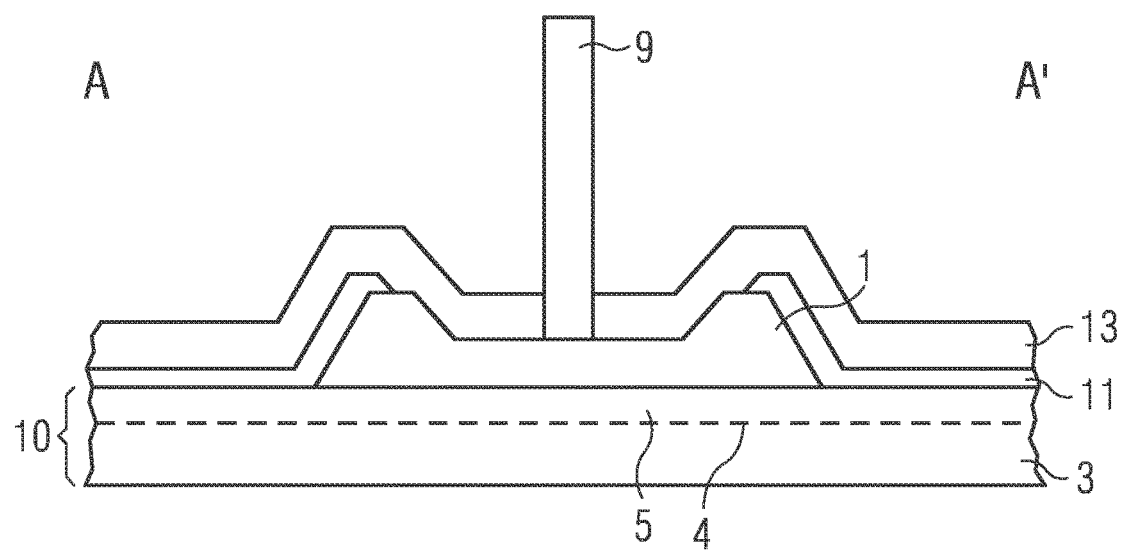

FIGS. 12A and 12B show a schematic plan view with a sectional representation AA' and a side view of the sectional representation AA' according to one embodiment. In FIG. 12B, the semiconductor chip includes a semiconductor layer sequence 10, on which a first dielectric mirror element 1 is arranged. An n-terminal contact 9 is applied on the first dielectric mirror 1. Furthermore, a passivation layer 13 overmolds the semiconductor layer sequence 10 and the first dielectric mirror element 1 and a current spreading structure 11. The n-terminal contact 9 is arranged over the p-doped semiconductor layer 5.

Figure 13:
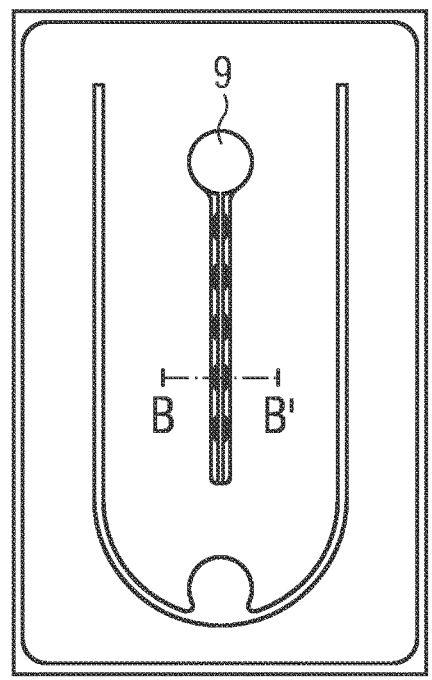
Figure 13:
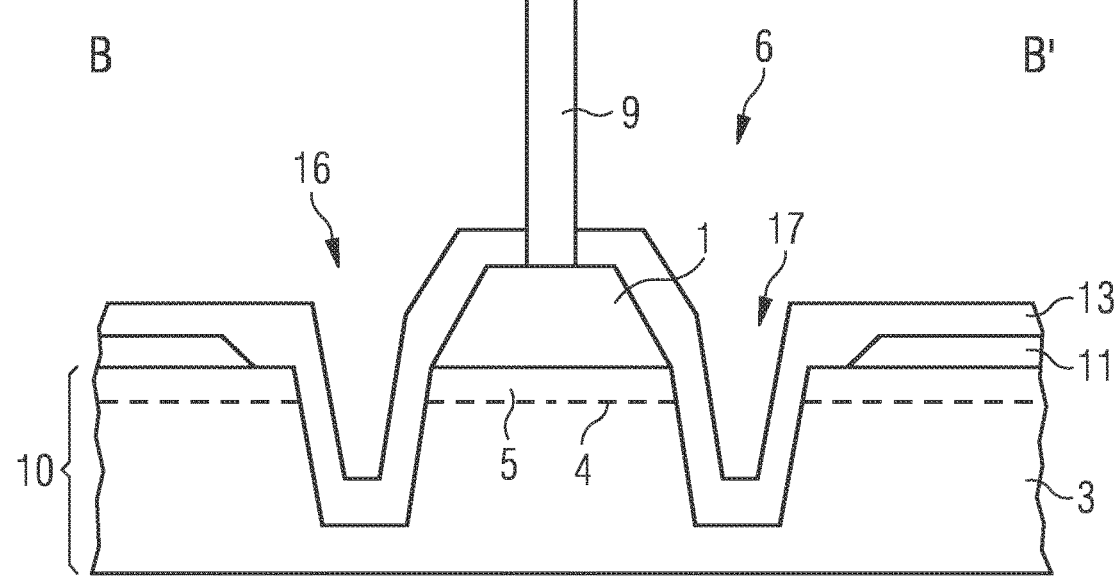

FIGS. 13A and 13B respectively show a schematic plan view and side view with a sectional representation BB' of a semiconductor chip according to one embodiment.

The n-terminal contact 9 is arranged over a first dielectric mirror element 1, a p-doped semiconductor layer 5, an active layer 4 and an n-doped semiconductor layer 3. Trenches 16 and 17 are shown on the left and right sides of the n-terminal contact 9. FIG. 13B shows that the first trench 6 is wider than the first dielectric mirror element 1. This results in a mesa trench which includes a first dielectric mirror element 1 that is electrically insulating. The mesa trench produces an island in which the p-doped semiconductor layer lies but is electrically insulated.

FIG. 14A shows a schematic plan view of a semiconductor chip with a sectional representation CC' according to one embodiment. FIG. 14B shows the sectional representation CC' of FIG. 14A. In FIG. 14B, a semiconductor layer sequence 10 is shown on which a current spreading structure 11, for example of ITO, is applied directly. A second dielectric mirror element 2 is applied on this current spreading structure 11. A p-terminal contact 8 is arranged on the second dielectric mirror element 2. A further current spreading structure 12, for example of ITO, is arranged between the p-terminal contact 8 and the second dielectric mirror element. Furthermore, this arrangement overmolds a passivation layer 13, for example of silicon dioxide.

Figure 15:
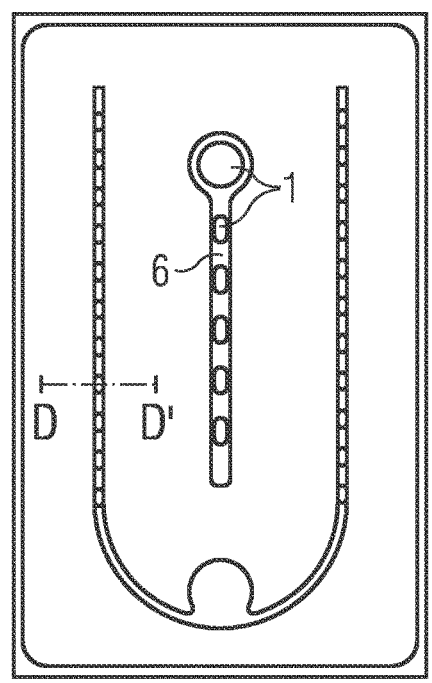
Figure 15:
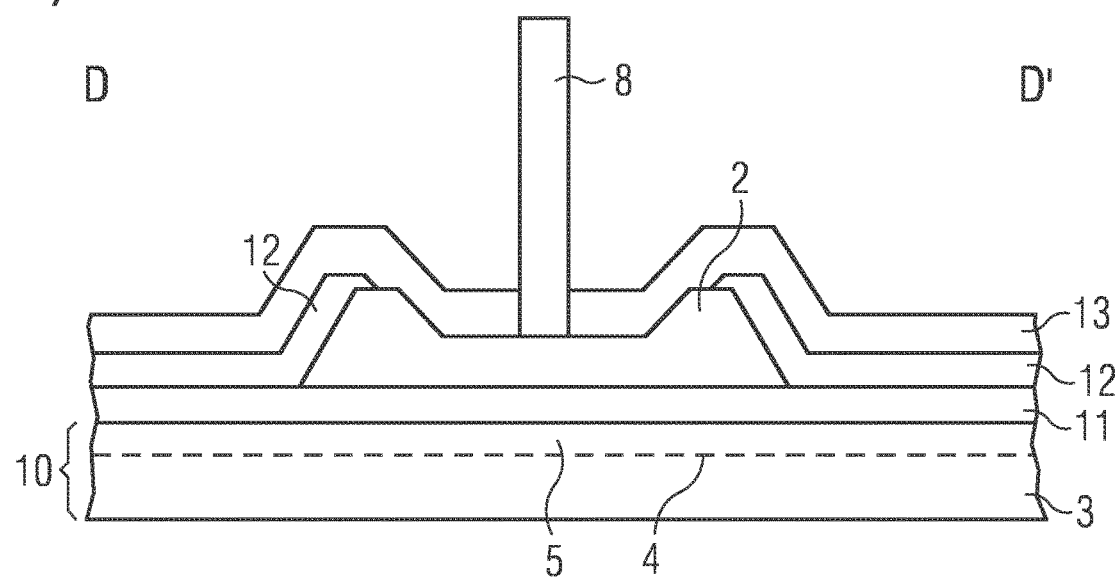

FIG. 15A shows a schematic plan view of a semiconductor chip according to one embodiment with a sectional representation DD'. FIG. 15B shows a schematic side view of the sectional representation DD' according to one embodiment.

FIG. 15B shows a semiconductor layer sequence 10 on which a current spreading structure 11, a second dielectric mirror element 2 and a p-terminal contact 8 are arranged. In this case, a further current spreading structure 12 is also applied, which is opened in the region of the p-terminal contact 8. Furthermore, a passivation layer 13 of $SiO_2$ is arranged over the arrangement.

Figure 16:
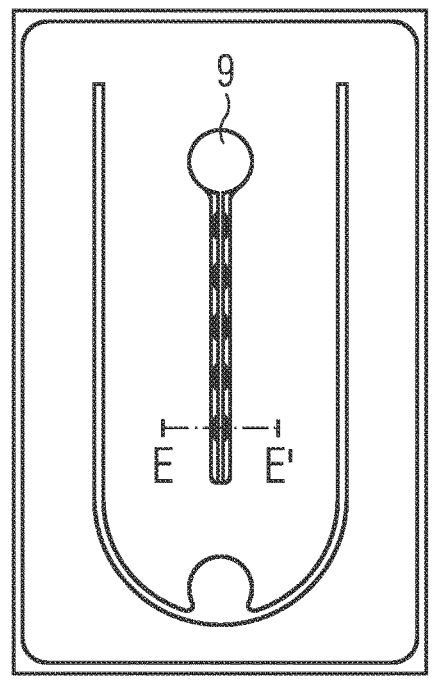
Figure 16:
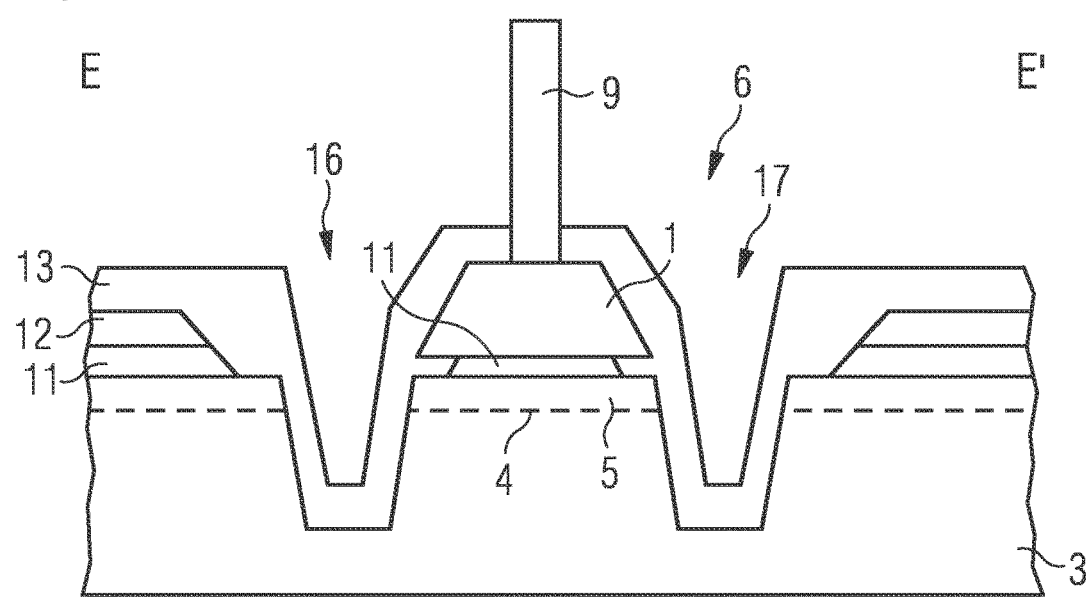

FIG. 16A shows a schematic plan view of a semiconductor chip according to one embodiment with a sectional representation EE'. FIG. 16B shows a schematic side view of the sectional representation EE'. Here, it is shown that the lateral extent of the first dielectric mirror element 1 is less than the lateral extent of the first trench 6. The first trench 6 thus includes two further trenches 16 and 17 on the left and right of the n-terminal contact 9. Arranged below the n-terminal contact 9 are the first dielectric mirror element 1, a current spreading structure 11, a p-doped semiconductor layer 5, an active layer 4 and an n-doped semiconductor layer 3, for example of gallium nitride. This structure may be obtained from the method as claimed in claim 17.

Figure 17:
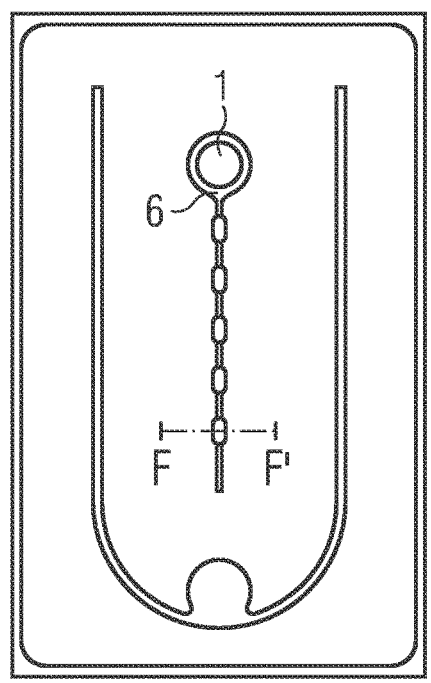
Figure 17:
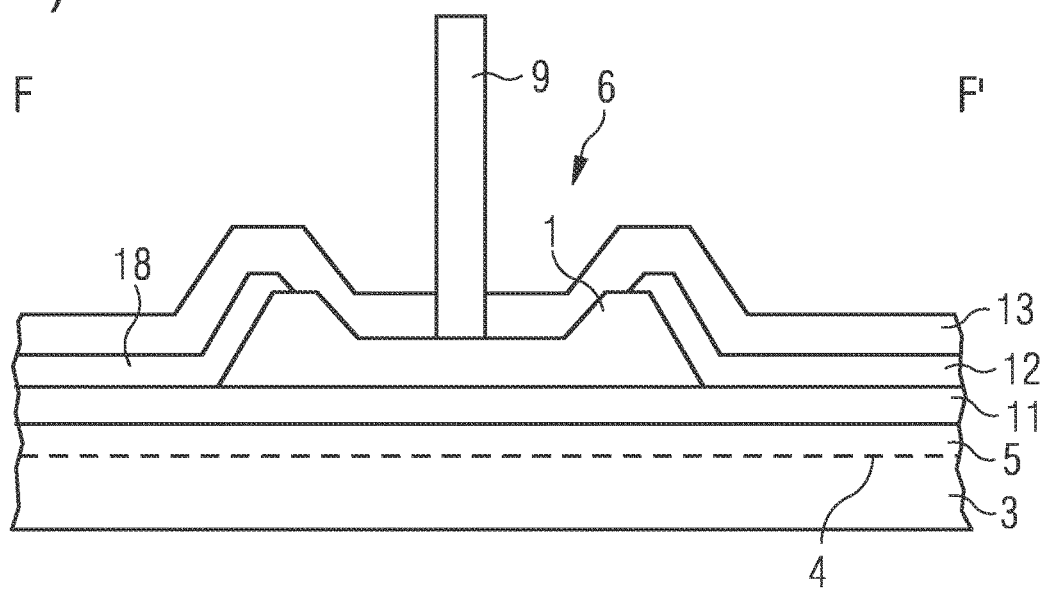

FIG. 17A shows a schematic plan view of an optoelectronic semiconductor chip with a sectional representation FF' according to one embodiment. FIG. 17B shows the associated schematic side view of the sectional representation FF'. In contrast to FIG. 16B, in this case the lateral extent of the first dielectric mirror element 1 is greater than that of the first trench 6.

Figure 14:
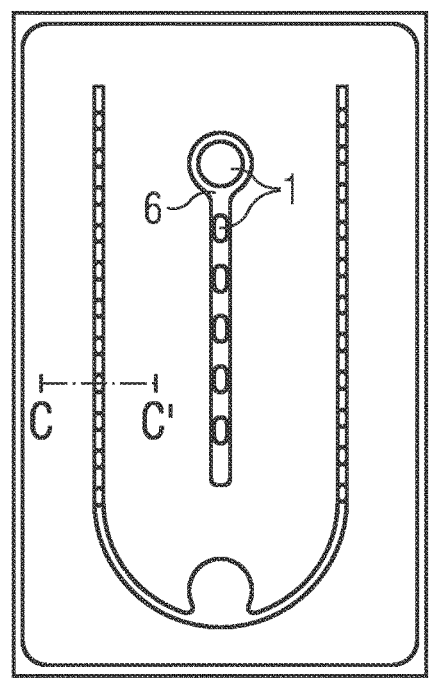
Figure 14:
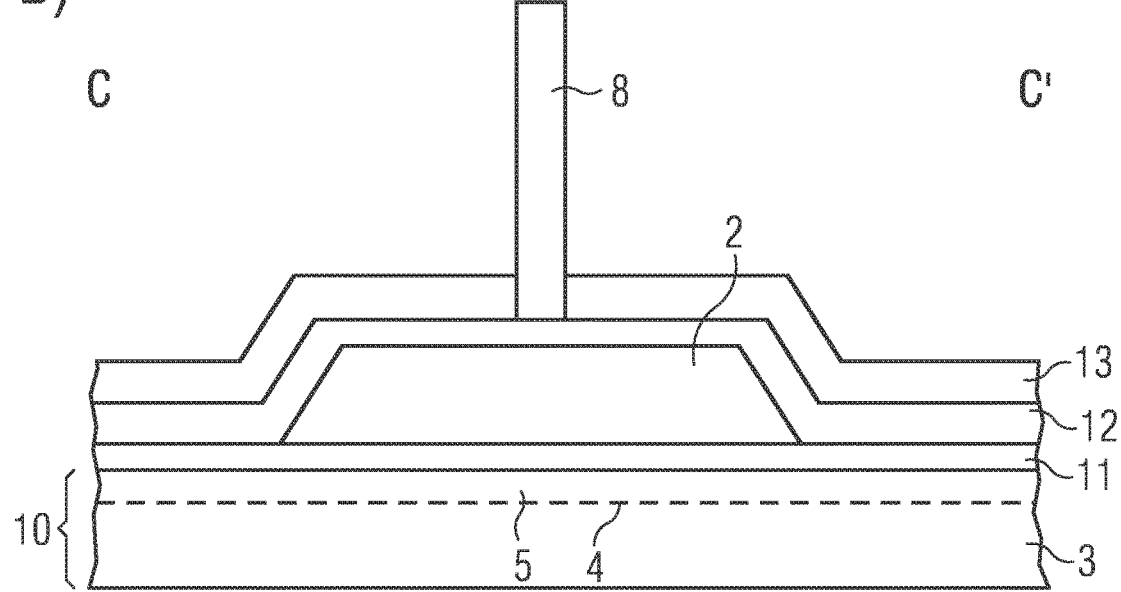

In summary, FIGS. 14A to 17B thus show an embodiment having a layer stack of a p- and n-terminal contact, the current spreading structures 11 and a further current spreading structure 12. The sectional representation CC' of FIG. 14A shows a p-terminal contact 8, the current spreading structure 11 being in direct contact with the p-doped semiconductor layer 5. The first dielectric mirror element 1 frames this contact and is arranged between the p-terminal contact 8 and the current spreading structure 11. The further current spreading structure 12 spreads the current in the lateral direction.

According to FIG. 15A, the electrical connection between the p-terminal contact and the further current spreading structure 12 is interrupted. Nevertheless, the p-doped semiconductor layer 5 below the second dielectric mirror element 2 is electrically connected by the current spreading structure 11. On the layer stack of the n-terminal contact 9 with the further current spreading structure 12 and the current spreading structure 11, the first trench 6 is wider than the first dielectric mirror 1. The current spreading structure 11 is treated again below the dielectric mirror element 1 so that there is no electrical contact between the n-terminal contact 9 and the current spreading structure 11. Furthermore, the current spreading structure 11 is electrically insulating.

In contrast thereto, the first trench 6 is wider than the first dielectric mirror element 1. A trench smaller than the dielectric mirror element allows for the current spreading structure an electrical contact of the p-doped semiconductor layer below the n-terminal contact.

FIGS. 18A, 18B, 18C and 18D respectively show a schematic plan view or side view of a high-voltage semiconductor chip.

The high-voltage semiconductor chip includes at least two optoelectronic semiconductor chips according to the embodiments described here. The optoelectronic semiconductor chips may also respectively be referred to as segments in connection with the high-voltage semiconductor chip.

Figure 18:
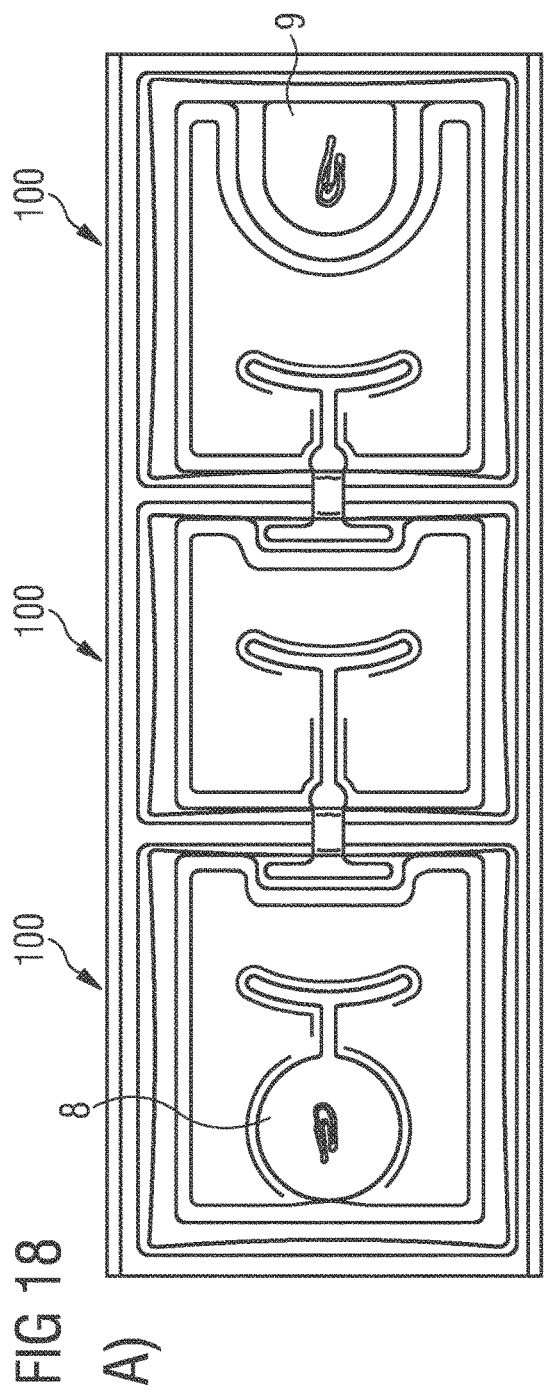
FIGS. 18A, 18D and 18H show a plan view or side view of a high-voltage semiconductor chip according to one embodiment, FIGS. 18B, 18C and 18E to 18G respectively show FIB images of a high-voltage semiconductor chip according to one embodiment.
Figure 18:
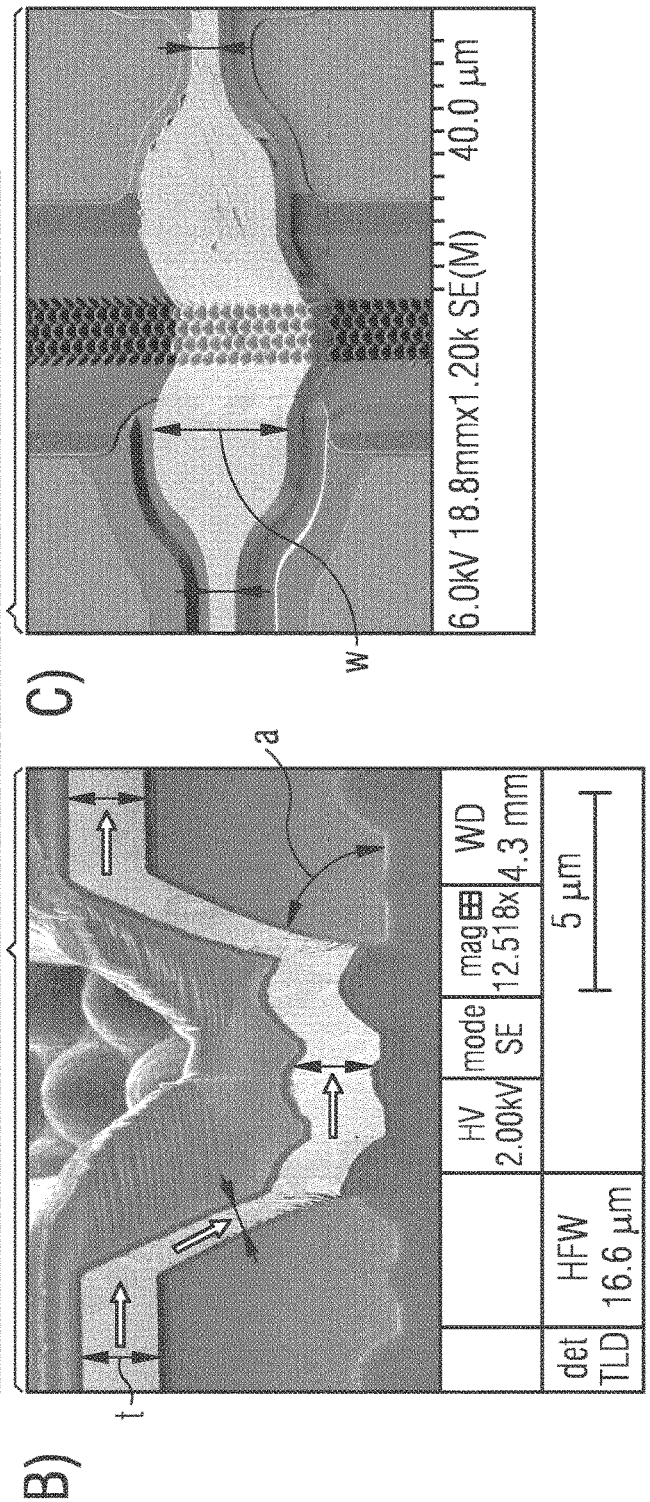
Figure 18:
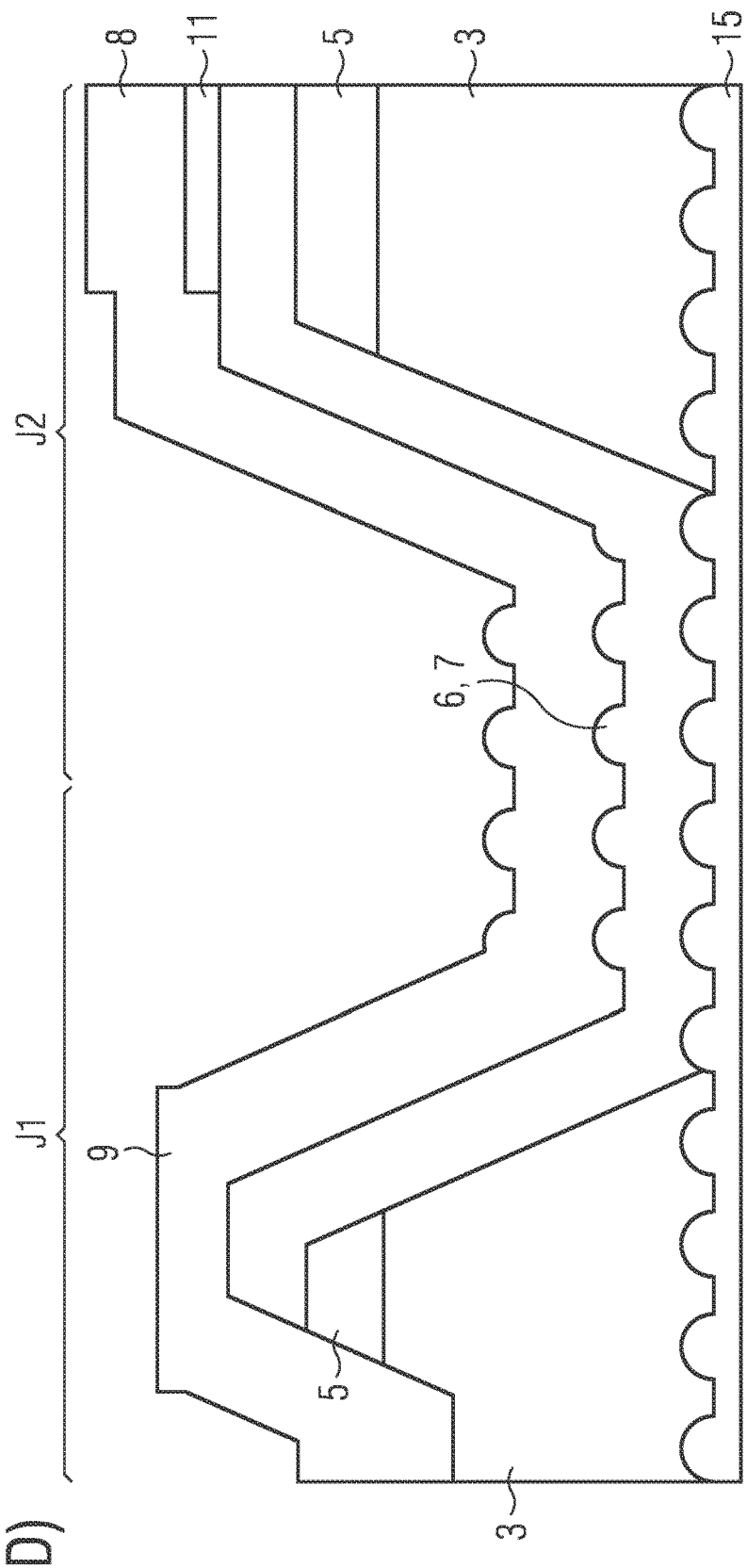
Figure 18:
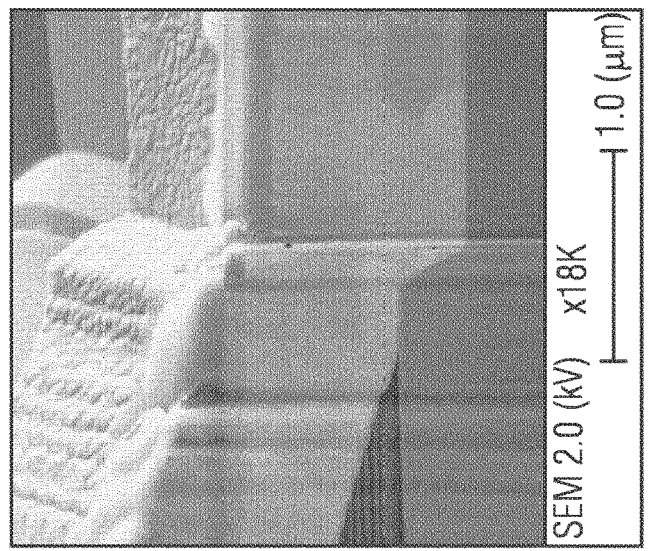
Figure 18:
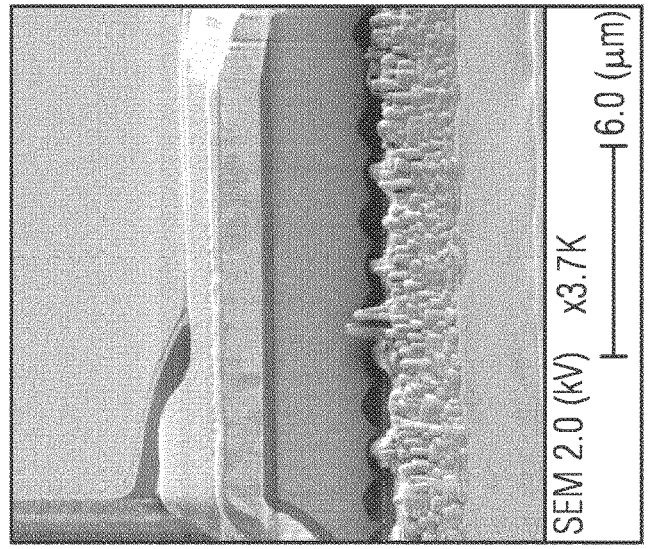
Figure 18:
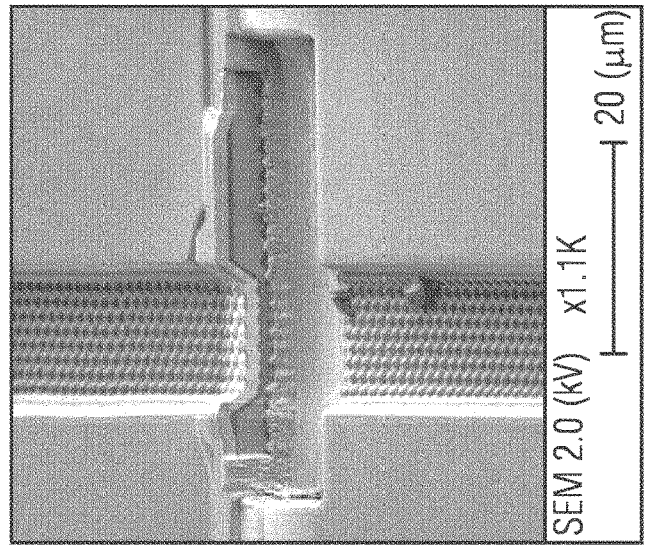
Figure 18:
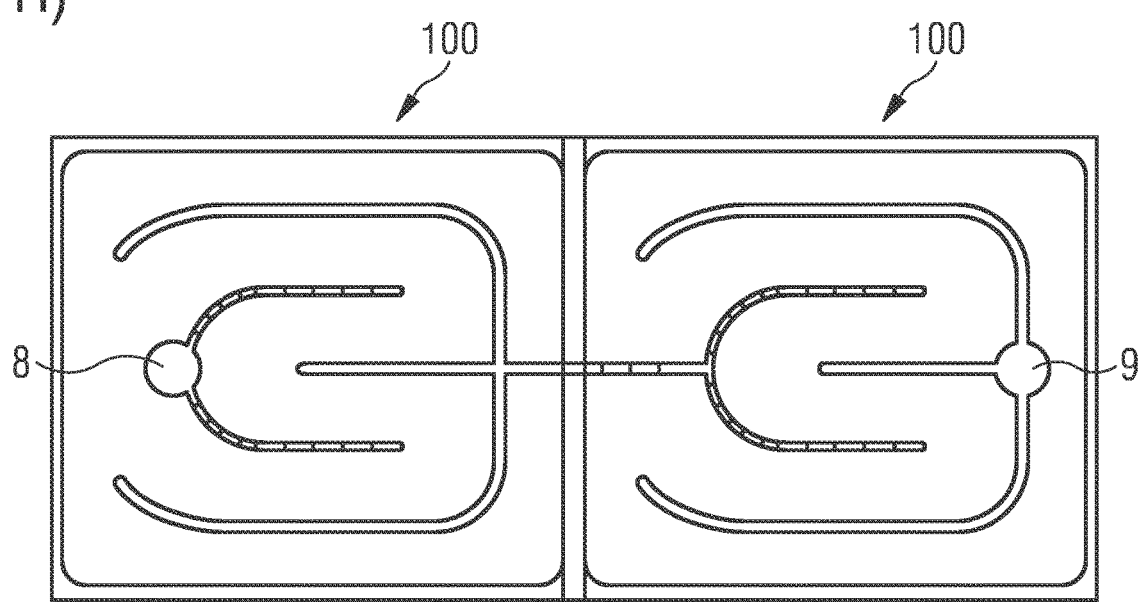

In the example of FIG. 18A, the high-voltage semiconductor chip includes three optoelectronic semiconductor chips according to the embodiments. Here, a high-voltage semiconductor chip means that the total voltage of the high-voltage semiconductor chip is greater than the total voltage of an optoelectronic semiconductor chip. If, for example, each optoelectronic semiconductor chip has a voltage of 3 V, three semiconductor chips in series in a high-voltage semiconductor chip have a total voltage of 9 V. The semiconductor chips are connected continuously to one another via an electrical connection. In a non-limiting embodiment, the substrate 15 is patterned. The current is transported from the p-terminal contact to the n-terminal contact and forwarded into the second semiconductor chip. Subsequently, the current flows from the p-terminal contact into the n-terminal contact in the third semiconductor chip to the p-terminal contact and subsequently to the n-terminal contact.

FIGS. 18B and 18C show an SEM and FIB image of a high-voltage semiconductor chip. The arrow representation in FIG. 18B shows the current flow, and the double-arrow representation shows the thickness t(a). The current flow may in this case be influenced by the angle a. FIG. 18C shows the thickness w by the arrows.

In a non-limiting embodiment, a triple-junction sapphire semiconductor chip is provided in this case. The three pn junctions are connected in series with one another, so that the voltage can be increased to 3×3 V=9 V. The three semiconductor chips are electrically separated from one another by deep mesa trenches. The p-terminal contact is applied on the first semiconductor chip on the left and the n-terminal contact is applied on the third semiconductor chip on the right. The n-terminal contact of the first semiconductor chip is connected to a p-terminal contact of the second semiconductor chip. The current can therefore pass via the trenches into the second semiconductor chip. The thickness of the gold (Au) at the terminal contact depends on the angle a and the depth of the first trench through the following formula: $t_{Au}(a)=t_{Au}(0)\cdot\cos(a)$ with t=layer thickness. In order to compensate for the reducing layer thickness of the gold that the angle a, the thickness w of the terminal contact is increased in the vicinity of the trench surface of the trench. This makes it possible for the cross section of the terminal contact to remain constant. In a non-limiting embodiment, the substrate 15 is an electrically insulating patterned sapphire substrate (PSS). In the region of the trench, a concave-convex topology of the PSS can be seen, and this must be covered by the terminal contact. This is disadvantageous, because additional metal surfaces absorb light.

In comparison with the method according to FIGS. 1A to 1C, in this case an additional method step is introduced before these method steps which are shown, this being intended to produce a deep trench. This production may be carried out by lithography or a lithography mask. In this case, a trench may be etched into, for example, a PSS substrate and the resist may subsequently be removed. The PSS is therefore electrically insulating, so that a plurality of semiconductor chips can be arranged on a printed circuit board.

FIG. 18D shows a schematic side view of two semiconductor chips (segments), which are connected in series. FIG. 18H shows the plan view of two semiconductor chips. An n-doped semiconductor layer 3, a p-doped semiconductor layer 5, a corresponding dielectric mirror element 6, 7, and an n-terminal contact 9, which merges from left to right into a p-terminal contact, are shown. Furthermore, a transparent electrically conductive layer 11 may be arranged below the p-terminal contact. The semiconductor layer sequence 10 may be arranged on a substrate, for example a patterned sapphire substrate (PSS).

FIGS. 18E to 18G show associated FIB images. A deep trench is represented. In detail, the n-terminal contact is electrically connected to the p-terminal contact. The p-terminal contact is in direct contact with the current spreading structure 11, which laterally spreads the current. Furthermore, the n-terminal contact may be in direct contact with the mesa edge. It is shown that the metal is arranged on the mesa edge and on the p-doped semiconductor layer (see also FIG. 5B). FIG. 18F is a magnification of a detail of FIG. 18E. FIG. 18G is a magnification of a detail of FIG. 18F (C—current, D—detector, A—angle).

Figure 19:
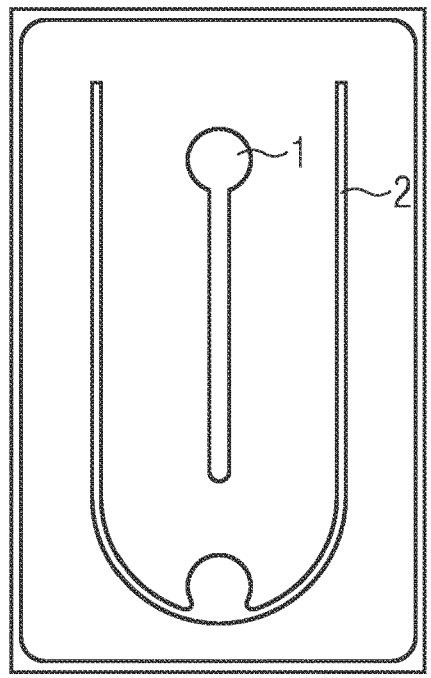
FIGS. 19A to 19C show a method for producing an optoelectronic component.
FIG. 19D shows a schematic side view of an optoelectronic semiconductor chip or component according to one embodiment, FIGS. 4C and 5C to 5F respectively show an FIB image of the side view of an optoelectronic semiconductor chip according to one embodiment.
Figure 19:
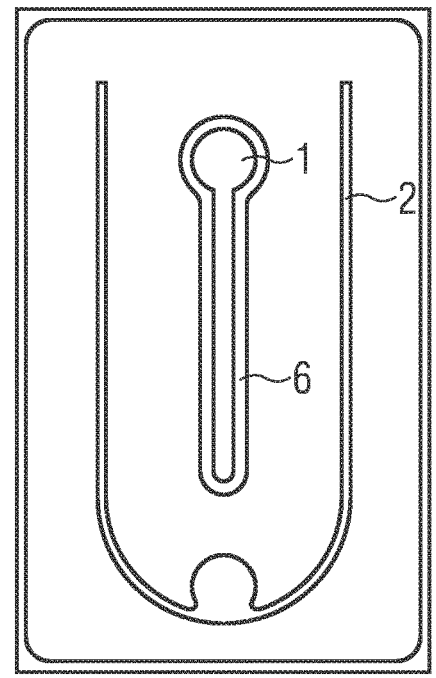
Figure 19:
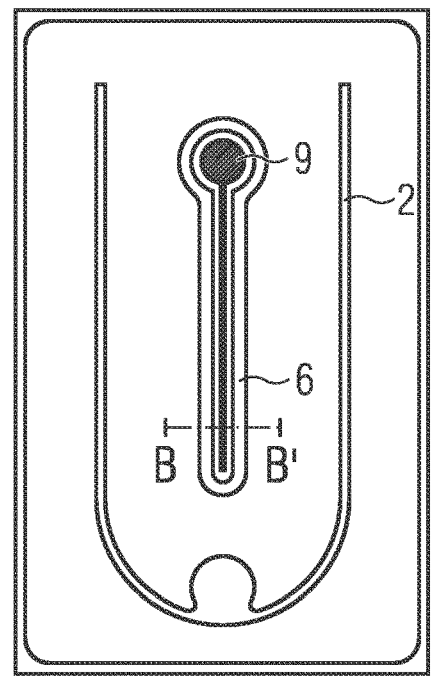
Figure 19:
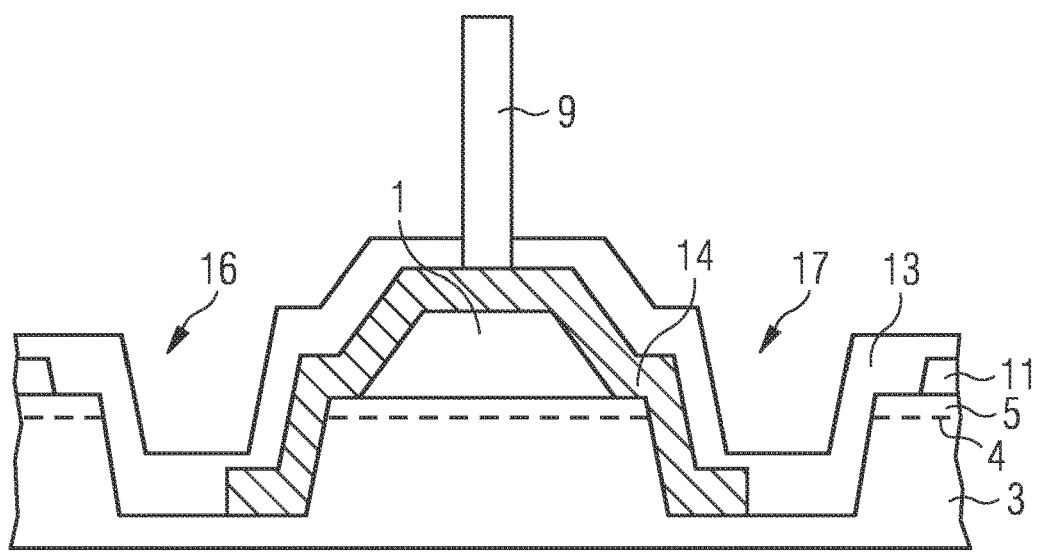

FIGS. 19A to 19C show a method for producing an optoelectronic component according to one embodiment. In contrast to the method according to FIGS. 1A to 1C, the first mirror layer 1 is applied in a simply connected fashion onto the semiconductor layer sequence.

As shown in FIG. 19B, in a next method step, the first trench 6 is produced in the semiconductor layer sequence. The latter fully encloses the first mirror element and does not penetrate through the first mirror element 1.

In a further step, a passivation layer 13 and a current spreading layer 14 may be deposited over the semiconductor layer sequence (not shown). The current spreading layer 14 is deposited in the regions of the first mirror element 1 and of the first trench 6. The passivation layer 13 is deposited fully over the semiconductor layer sequence. The current spreading layer 14 is arranged between the passivation layer 13 and the semiconductor layer sequence.

According to FIG. 19C, the passivation layer 13 is ablated in regions as far as the first mirror element 1. In the regions in which the first mirror element 1 is removed, the n-terminal contact 9 is applied. The n-terminal contact 9 has no direct contact with the n-doped semiconductor layer 3, which is exposed in the first trench 6.

In contrast to the embodiment in connection with FIG. 4B, the embodiment in connection with FIG. 19D shows a schematic side view in the sectional representation BB', which according to FIG. 19D is a cross section through the first trench 6. The current spreading layer 14 extends from the first dielectric mirror element 1 into the first trench 6. Furthermore, the current spreading layer 14 is in direct contact with the n-terminal contact 9, the first dielectric mirror element 1 and in regions with the p-doped semiconductor layer 5, and the n-doped semiconductor layer 3. By the current spreading layer 14, the n-doped semiconductor layer 3 is supplied with current via the n-terminal contact 9.

The embodiments described in connection with the figures, and the features thereof, may also be combined with one another according to further embodiments, even if such combinations are not explicitly shown in the figures. Furthermore, the embodiments described in connection with the figures may include additional or alternative features according to the description in the general part.

This patent application claims the priority of German Patent application 10 2017 117 164.9, the disclosure content of which is incorporated here by reference.

The invention is not restricted by the description with the aid of the embodiments to the latter. Rather, the invention includes any new feature and any combination of features, which includes the combination of features in the patent claims, even if this feature or this combination is not itself explicitly indicated in the patent claims or embodiments.

LIST OF REFERENCES 100 optoelectronic semiconductor chip
10 semiconductor layer sequence
1 first dielectric mirror element
2 second dielectric mirror element
3 n-doped semiconductor layer
4 active layer
5 p-doped semiconductor layer
6 first trench
61 side surface of the first trench
62 bottom surface of the first trench
7 second trench
71 side surface of the second trench
72 bottom surface of the second trench
8 p-terminal contact
9 n-terminal contact
11 current spreading structure
12 further current spreading structure
13 passivation layer
14 current spreading layer
15 substrate
16 (partial) trench
17 (partial) trench
18 holes

The invention claimed is:

1. An optoelectronic semiconductor chip, comprising
a semiconductor layer sequence comprising at least one n-doped semiconductor layer, at least one p-doped semiconductor layer, and an active layer arranged between the at least one n-doped semiconductor layer and the at least one p-doped semiconductor layer;
a p-terminal contact electrically contacting the p-doped semiconductor layer;
an n-terminal contact electrically contacting the n-doped semiconductor layer;
wherein the n-terminal contact is arranged in direct contact with the p-doped semiconductor layer at least in regions; and
a first dielectric mirror element is arranged in regions between the p-doped semiconductor layer and the n-terminal contact.

2. The optoelectronic semiconductor chip as claimed in claim 1,
wherein the n-terminal contact is arranged in direct contact with a first trench and the active layer.

3. The optoelectronic semiconductor chip as claimed in claim 1,
wherein the n-terminal contact is metallic and is arranged at least in regions over the p-doped semiconductor layer and the n-doped semiconductor layer,
wherein the n-terminal contact and the p-doped semiconductor layer are electrically separated by a first dielectric mirror element except at least in one region of the first trench in which the n-terminal contact is arranged in direct contact with the p-doped semiconductor layer.

4. The optoelectronic semiconductor chip as claimed in claim 1,
wherein the semiconductor chip comprises at least one first trench, wherein the n-terminal contact extends inside the first trench, wherein the n-terminal contact is arranged in direct mechanical contact with the p-doped semiconductor layer inside the first trench.

5. The optoelectronic semiconductor chip as claimed in claim 1,
which if applicable comprises a second dielectric mirror element,
wherein the first dielectric mirror element and/or a second dielectric mirror element is configured as a distributed Bragg reflector.

6. The optoelectronic semiconductor chip as claimed in claim 1,
wherein the first trench comprises a partial sidewall which makes having an angle a of less than 70° with the n-doped semiconductor layer.

7. The optoelectronic semiconductor chip as claimed in claim 1,
wherein the first trench comprises a partial sidewall having an angle a of less than 60° or less than 45° with the n-doped semiconductor layer.

8. The optoelectronic semiconductor chip as claimed in claim 1,
wherein a current spreading structure is arranged between the p-terminal contact and the first dielectric mirror element or a second dielectric mirror element,
wherein the current spreading structure extends over the p-doped semiconductor layer and the first dielectric mirror element or the second dielectric mirror element.

9. The optoelectronic semiconductor chip as claimed in claim 1,
wherein the first dielectric mirror element and/or a second dielectric mirror comprises regions formed in the shape of islands arranged in direct contact with the p-doped semiconductor layer.

10. The optoelectronic semiconductor chip as claimed in claim 1,
wherein, as seen in lateral cross section, the first dielectric mirror element and/or a second dielectric mirror element has a smaller or larger lateral extent than the first trench and/or a second trench.

11. The optoelectronic semiconductor chip as claimed in claim 1,
wherein a further current spreading structure is arranged between the p-terminal contact and a second dielectric mirror element,
wherein the further current spreading structure extends over the p-doped semiconductor layer and the second dielectric mirror element, wherein the current spreading structure is arranged between the second dielectric mirror element and the p-doped semiconductor layer.

12. The optoelectronic semiconductor chip as claimed in claim 1,
wherein the first and/or second dielectric mirror element comprises at least one of the materials $Al_2O_3$, $Ta_2O_5$, $ZrO_2$, ZnO, $SiN_x$, $SiO_xN_y$, $SiO_2$, $TiO_2$, $ZrO_2$, $HfO_2$, $Nb_2O_5$, $MgF_2$, or combinations thereof.

13. The optoelectronic semiconductor chip as claimed in claim 1,
wherein the first dielectric mirror element and/or second dielectric mirror element comprises a layer sequence having alternating layers of $SiO_2$ and $TiO_2$ or $SiO_2$ and $Nb_2O_5$.

14. The optoelectronic semiconductor chip as claimed in claim 1,
wherein a direct current flow between the p-terminal contact or n-terminal contact and the p- and n-doped semiconductor layers and the active layer is prevented by the first dielectric mirror element and/or a second dielectric mirror element.

15. The optoelectronic semiconductor chip as claimed in claim 1,
wherein a second dielectric mirror element is arranged between the p-terminal contact and the p-doped semiconductor layer, wherein a current spreading structure is arranged over the p-doped semiconductor layer, wherein the current spreading structure is at least in regions opened in the region of the p-terminal contact.

16. A high-voltage semiconductor chip comprising at least two optoelectronic semiconductor chips as claimed in claim 1.

17. A method for producing an optoelectronic semiconductor chip as claimed in claim 1, wherein the method comprises:
providing a semiconductor layer sequence having at least one first trench comprising at least one n-doped semiconductor layer, at least one p-doped semiconductor layer, and an active layer arranged between the at least one n-doped semiconductor layer and the at least one p-doped semiconductor layer;
providing a first dielectric mirror element and etching a first trench, the first trench being adapted to receive an n-terminal contact which electrically contacts the n-doped semiconductor layer;
applying the n-terminal contact at least in regions onto the n-doped semiconductor layer and onto the p-doped semiconductor layer, the n-terminal contact being arranged in direct contact with the p-doped semiconductor layer at least in regions, and the n-terminal contact if applicable being arranged in direct contact with a first trench and the active layer.

* * * * *